United States Patent
Yamazaki

(10) Patent No.: US 7,067,976 B2
(45) Date of Patent: Jun. 27, 2006

(54) LIGHT-EMITTING DEVICE, METHOD OF MANUFACTURING A LIGHT-EMITTING DEVICE, AND ELECTRONIC EQUIPMENT

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/976,988

(22) Filed: Oct. 29, 2004

(65) Prior Publication Data

US 2005/0088088 A1 Apr. 28, 2005

Related U.S. Application Data

(62) Division of application No. 10/183,282, filed on Jun. 27, 2002.

(30) Foreign Application Priority Data

Jul. 3, 2001 (JP) ............................. 2001-201580

(51) Int. Cl.
*H01J 1/62* (2006.01)
*H01L 33/00* (2006.01)

(52) U.S. Cl. ................. 313/512; 313/506; 313/504; 313/500; 313/511; 313/498; 427/66; 428/690

(58) Field of Classification Search ............. 313/512, 313/504–506; 428/690, 917; 257/99, 100
See application file for complete search history.

(56) References Cited

U.S. PATENT DOCUMENTS

| | | | |
|---|---|---|---|
| 4,489,481 A | 12/1984 | Jones | ............... 29/591 |
| 5,094,709 A | 3/1992 | Eichelberger et al. | ... 156/380.9 |
| 5,107,175 A | 4/1992 | Hirano et al. | ............... 313/512 |
| 5,124,204 A | 6/1992 | Yamashita et al. | ............ 428/331 |
| 5,189,405 A | 2/1993 | Yamashita et al. | ............ 340/781 |
| 5,376,561 A | 12/1994 | Vu et al. | .................. 437/31 |
| 5,455,625 A | 10/1995 | Englander | ................. 348/375 |
| 5,583,369 A | 12/1996 | Yamazaki et al. | ........... 257/635 |

(Continued)

FOREIGN PATENT DOCUMENTS

EP 0 773 166 5/1997

(Continued)

OTHER PUBLICATIONS

Tsutsui, T. et al, "Electroluminescence in Organic Thin Films," Photochemical Processes in Organized Molecular Systems, pp. 437-450, Elsevier Science Publishers, Tokyo, (1991).

(Continued)

*Primary Examiner*—Karabi Guharay
*Assistant Examiner*—Sikha Roy
(74) *Attorney, Agent, or Firm*—Cook, Alex, McFarron, Manzo, Cummings & Mehler, Ltd.

(57) ABSTRACT

The present invention uses plastic film in vacuum sealing an OLED. Inorganic insulating films which can prevent oxygen or water from being penetrated therein and an organic insulating film which has a smaller internal stress than that of the inorganic insulating films are laminated on an inside of the plastic film. By sandwiching the organic insulating film between the inorganic insulating films, a stress can be relaxed. Further, by laminating a plurality of inorganic insulating films, even if one of the inorganic insulating films has a crack, the other inorganic insulating films can effectively prevent oxygen or water from being penetrated into an organic light emitting layer. Further, the stress of the entire sealing film can be relaxed and cracking due to the stress takes place less often.

74 Claims, 21 Drawing Sheets

U.S. PATENT DOCUMENTS

| | | | | |
|---|---|---|---|---|
| 5,627,364 | A | 5/1997 | Codama et al. | 250/208.1 |
| 5,643,826 | A | 7/1997 | Ohtani et al. | 437/88 |
| 5,674,304 | A | 10/1997 | Fukada et al. | 65/32.4 |
| 5,681,759 | A | 10/1997 | Zhang | 437/21 |
| 5,686,360 | A | 11/1997 | Harvey, III et al. | 437/211 |
| 5,693,956 | A | 12/1997 | Shi et al. | 257/40 |
| 5,696,386 | A | 12/1997 | Yamazaki | 257/57 |
| 5,731,048 | A | 3/1998 | Ashe et al. | 427/585 |
| 5,757,126 | A | 5/1998 | Harvey, III et al. | 313/506 |
| 5,757,456 | A | 5/1998 | Yamazaki et al. | 349/151 |
| 5,766,977 | A | 6/1998 | Yamazaki | 438/151 |
| 5,771,562 | A | 6/1998 | Harvey, III et al. | 313/504 |
| 5,811,177 | A | 9/1998 | Shi et al. | 428/209 |
| 5,821,138 | A | 10/1998 | Yamazaki et al. | 438/166 |
| 5,834,327 | A | 11/1998 | Yamazaki et al. | 438/30 |
| 5,946,561 | A | 8/1999 | Yamazaki et al. | 438/166 |
| 5,952,778 | A | 9/1999 | Haskal et al. | 313/504 |
| 5,953,595 | A | 9/1999 | Gosain et al. | 438/158 |
| 5,973,449 | A | 10/1999 | Nakamura et al. | 313/506 |
| 5,990,542 | A | 11/1999 | Yamazaki | 257/642 |
| 6,022,792 | A | 2/2000 | Ishii et al. | 438/462 |
| 6,127,199 | A | 10/2000 | Inoue et al. | 438/30 |
| 6,133,626 | A | 10/2000 | Hawke et al. | 257/686 |
| 6,144,108 | A | 11/2000 | Ohizumi et al. | 257/793 |
| 6,146,225 | A | 11/2000 | Sheats et al. | 445/24 |
| 6,150,187 | A | 11/2000 | Zyung et al. | 438/26 |
| 6,168,963 | B1 | 1/2001 | Freund et al. | 438/26 |
| 6,191,492 | B1 | 2/2001 | Yamazaki et al. | 257/787 |
| 6,198,217 | B1 | 3/2001 | Suzuki et al. | 313/504 |
| 6,198,220 | B1 | 3/2001 | Jones et al. | 313/512 |
| 6,258,623 | B1 | 7/2001 | Moden et al. | 438/106 |
| 6,268,631 | B1 | 7/2001 | Fukada et al. | 257/347 |
| 6,268,695 | B1 | 7/2001 | Affinito | 313/504 |
| 6,274,887 | B1 | 8/2001 | Yamazaki et al. | 257/72 |
| 6,287,955 | B1 | 9/2001 | Wang et al. | 438/623 |
| 6,317,175 | B1 | 11/2001 | Salerno et al. | 349/45 |
| 6,329,087 | B1 | 12/2001 | Okamoto | 428/692 |
| 6,372,608 | B1 | 4/2002 | Shimoda et al. | 438/455 |
| 6,376,105 | B1 | 4/2002 | Jonas et al. | 428/690 |
| 6,376,333 | B1 | 4/2002 | Yamazaki et al. | 438/458 |
| 6,413,645 | B1 | 7/2002 | Graff et al. | 428/446 |
| 6,423,614 | B1 | 7/2002 | Doyle | 438/458 |
| 6,445,005 | B1 | 9/2002 | Yamazaki et al. | 257/72 |
| 6,475,845 | B1 | 11/2002 | Kimura | 438/200 |
| 6,479,376 | B1 * | 11/2002 | Huang et al. | 438/613 |
| 6,522,067 | B1 | 2/2003 | Graff et al. | 313/512 |
| 6,537,688 | B1 | 3/2003 | Silvernail et al. | 428/690 |
| 6,541,294 | B1 | 4/2003 | Yamazaki et al. | 438/29 |
| 6,586,772 | B1 | 7/2003 | Bijlsma | 257/72 |
| 6,589,619 | B1 | 7/2003 | Nagashima | 428/36.6 |
| 6,605,826 | B1 | 8/2003 | Yamazaki et al. | 257/72 |
| 6,639,360 | B1 | 10/2003 | Roberts et al. | 313/512 |
| 6,771,677 | B1 | 8/2004 | Furukawa et al. | 372/36 |
| 6,822,391 | B1 * | 11/2004 | Yamazaki et al. | 313/512 |
| 6,849,877 | B1 * | 2/2005 | Yamazaki et al. | 257/86 |
| 2001/0001485 | A1 | 5/2001 | Bao et al. | 257/89 |
| 2001/0011726 | A1 | 8/2001 | Hayashi et al. | 257/59 |
| 2001/0015256 | A1 | 8/2001 | Yamazaki et al. | 156/289 |
| 2001/0026835 | A1 | 10/2001 | Tanaka | 427/96 |
| 2001/0030323 | A1 | 10/2001 | Ikeda | 257/59 |
| 2001/0040645 | A1 | 11/2001 | Yamazaki | 349/42 |
| 2002/0017643 | A1 | 2/2002 | Koyama | 257/59 |
| 2002/0030189 | A1 | 3/2002 | Ishikawa | 257/59 |
| 2002/0047120 | A1 | 4/2002 | Inukai | 257/59 |
| 2002/0113549 | A1 | 8/2002 | Yamazaki et al. | 313/506 |
| 2002/0125817 | A1 | 9/2002 | Yamazaki et al. | 313/498 |
| 2002/0158577 | A1 | 10/2002 | Shimoda et al. | 313/506 |
| 2002/0190257 | A1 | 12/2002 | Yamazaki et al. | 257/72 |
| 2003/0027369 | A1 | 2/2003 | Yamazaki et al. | 438/21 |
| 2003/0034497 | A1 | 2/2003 | Yamazaki et al. | 257/86 |
| 2003/0057422 | A1 | 3/2003 | Yamazaki et al. | 257/79 |
| 2003/0155573 | A1 | 8/2003 | Yamazaki et al. | 257/72 |
| 2003/0206332 | A1 | 11/2003 | Yamazaki et al. | 359/312 |

FOREIGN PATENT DOCUMENTS

| | | |
|---|---|---|
| EP | 1 058 484 A1 | 12/2000 |
| JP | 64-059791 | 3/1989 |
| JP | 01-205094 | 8/1989 |
| JP | 03-062497 | 3/1991 |
| JP | 05-069520 | 3/1993 |
| JP | 05-315630 | 11/1993 |
| JP | 06-076948 | 3/1994 |
| JP | 07-065950 | 3/1995 |
| JP | 08-068990 | 3/1996 |
| JP | 08-288522 | 11/1996 |
| JP | 10-125929 | 5/1998 |
| JP | 10-125931 | 5/1998 |
| JP | 2000-173027 | 6/2000 |
| JP | 2000-188367 | 7/2000 |
| JP | 2001-093661 | 4/2001 |
| JP | 2001-118674 | 4/2001 |
| JP | 2002-082633 | 3/2002 |

OTHER PUBLICATIONS

Baldo, M.A. et al, "Highly Efficient Phosphorescent Emission from Organic Electroluminescent Devices," Nature, vol. 395, pp. 151-154, Sep. 10, (1998).

Baldo, M.A. et al, "Very High-Efficiency Green Organic Light-Emitting Devices Based on Electrophosphorescence," Applied Physics Letters, vol. 75, No. 1, pp. 4-6, Jul. 5, (1999).

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L1502-L1504, Dec. 15, (1999).

Office Action re Japanese Patent Application No. JP 2002-191956, dated Feb. 1, 2005 (with partial English translation).

U.S. Appl. No. 09/760,499 (pending) to Yamazaki filed Jan. 11, 2001, including specification, claims, abstract and drawings.

* cited by examiner

LIGHT-EMITTING DEVICE, METHOD OF MANUFACTURING A LIGHT-EMITTING DEVICE, AND ELECTRONIC EQUIPMENT

This application is a divisional of copending U.S. application Ser. No. 10/183,282, filed on Jun. 27, 2002.

BACKGROUND OF THE INVENTION

1. Field of the Invention

The present invention relates to the fabrication method of Semiconductor device and specially relates to a light-emitting device which includes an OLED (organic light-emitting device) panel which is formed on a plastic substrate. The invention also relates to an OLED module obtained by mounting an IC that includes a controller to the OLED panel. In this specification, a light-emitting device is used as the generic term for the OLED panel and the OLED module. Also included in the present invention is electronic equipment using the light-emitting device.

2. Description of the Related Art

In recent years, a technique of forming a TFT (Thin film transistor) on a substrate has made great advancement to promote application of TFTs to active matrix display devices. In particular, TFTs using polysilicon have higher field effect mobility (also called mobility) than conventional TFTs that use amorphous silicon and therefore can operate at high speed. This makes it possible to control pixels, which has conventionally been controlled by a driving circuit external to the substrate, by a driving circuit formed on the same substrate on which the pixels are formed.

With various circuits and elements formed on the same substrate, active matrix display devices can have many advantages including lowering of manufacture cost, reduction in display device size, an increase in yield, and improvement in throughput.

An active matrix light-emitting device having an OLED as a self-luminous element (hereinafter simply referred to as light emitting device) is being researched actively. A light-emitting device is also called as an organic EL display (OELD) or an organic light emitting diode (OLED).

Being self-luminous, an OLED does not need back light which is necessary in liquid crystal display devices (LCDs) and is therefore easy to make a thinner device. In addition, a self-luminous OLED has high visibility and no limitation in terms of viewing angle. These are the reasons why light emitting devices using OLEDs are attracting attention as display devices to replace CRTs and LCDs.

An OLED has a layer containing an organic compound (organic light emitting material) that provides luminescence (electroluminescence) when an electric field is applied (the layer is hereinafter referred to as organic light emitting layer), in addition to an anode layer and a cathode layer. Luminescence obtained from organic compounds is classified into light emission upon return to the base state from singlet excitation (fluorescence) and light emission upon return to the base state from triplet excitation (phosphorescence). A light-emitting device according to the present invention can use one or both types of light emission.

In this specification, all the layers that are provided between an anode and a cathode of an OLED together make an organic light-emitting layer. Specifically, an organic light-emitting layer includes a light-emitting layer, a hole injection layer, an electron injection layer, a hole transporting layer, an electron transporting layer, etc. A basic structure of an OLED is a laminate of an anode, a light-emitting layer, and a cathode layered in this order. The basic structure can be modified into a laminate of an anode, a hole injection layer, a light-emitting layer, and a cathode layered in this order, a laminate of an anode, a hole injection layer, a light emitting layer, an electron transporting layer, and a cathode layered in this order, or the like.

Various applications of such light-emitting device are expected. In particular, applications to portable equipment are attracting attention because the light-emitting device is thin and accordingly is useful in reducing the weight. This has prompted attempts to form an OLED on a flexible plastic film.

A light-emitting device in which an OLED is formed on a flexible substrate such as a plastic film is thin and lightweight and moreover, applicable to a curved display or show window, etc. Therefore, the use thereof is not limited to portable equipment and its application range is very wide.

However, plastic substrates in general are well transmissive of moisture and oxygen, which accelerate degradation of organic light emitting layers. Therefore plastic substrates often shorten the lifetime of light-emitting devices. This is solved in prior art by placing an insulating film such as a silicon nitride film or a silicon oxynitride film between a plastic substrate and an OLED to prevent moisture and oxygen from entering an organic light emitting layer.

Plastic film substrates in general are also weak against heat and are easily deformed if the insulating film such as a silicon nitride film or a silicon oxynitride film is formed at a temperature that is too high. On the other hand, if the temperature at which the insulating film is formed is too low, the quality of the film is reduced and the film cannot prevent transmission of moisture and oxygen satisfactorily.

When the insulating film such as a silicon nitride film or a silicon oxynitride film is increased in thickness in order to prevent transmission of moisture and oxygen, the internal stress is increased to likely cause a crack (fissure). The thick insulating film makes the substrate weak against cracking when the substrate is bent.

SUMMARY OF THE INVENTION

The present invention has been made in view of the above, and an object of the present invention is therefore to provide a light-emitting device with an OLED formed on a plastic substrate which is capable of avoiding degradation due to transmission of moisture and oxygen.

The present invention relates to a technique of sealing an OLED formed on a substrate that has an insulating surface. According to the present invention, the OLED is sealed by vacuum sealing using a plastic film that is lined with layers of insulating films on the inside. The layers of insulating films include at least an insulating film which is made of an inorganic material and which is capable of preventing transmission of oxygen and moisture (hereinafter referred to as inorganic insulating film), and an insulating film which is made of an organic material and which is smaller in internal stress than the inorganic insulating film.

Specifically, two or more layers of inorganic insulating films are formed and an organic insulating film containing a resin is placed between the inorganic insulating films. A bag-like plastic film lined with the three or more layers of insulating films on the inside is used to house a substrate on which an OLED is formed to seal the OLED and complete the light-emitting device.

In order to enhance the softness of the plastic film having the inorganic insulating films, the internal stress of the inorganic insulating films may be relaxed by adding a noble gas element to reaction gas for forming the inorganic insulating films.

The present invention employs a plurality of layers of inorganic insulating films. Therefore, if one inorganic insulating film is cracked, the other inorganic insulating films effectively prevent moisture and oxygen from entering an organic light-emitting layer. With the plurality of layers of inorganic insulating films, the present invention can effectively prevent moisture and oxygen from entering an organic light-emitting layer even when the quality of the inorganic insulating films is degraded by low temperature during formation of the inorganic insulating films.

The internal stress of the insulating films can be relaxed when an organic insulating film that is smaller in internal stress than the inorganic insulating films is interposed between the inorganic insulating films. Compared to a single layer of inorganic insulating film having the same thickness as the total thickness of the inorganic insulating films sandwiching the organic insulating film, cracking due to the internal stress takes place less frequently in the inorganic insulating films sandwiching the organic insulating film.

By layering the inorganic insulating films and the organic insulating film, the flexibility is increased and cracking upon bending can be avoided.

The laminate of the inorganic insulating films and organic insulating film (hereinafter referred to as sealing film) is formed by vacuum press-fitting so that it is closely fit to the substrate on which the OLED is formed. Accordingly, the sealing film is a film having a certain degree of softness and transparency or translucency to visible light.

In this specification, being transparent to visible light means having a visible light transmittance of 80 to 100%, and being translucent to visible light means having a visible light transmittance of 50 to 80%.

In the above structure, it is preferable to place a driving agent between the substrate on which the OLED is formed and the vacuum-sealed plastic film in order to prevent degradation of the OLED. A suitable drying agent is barium oxide, silica gel, or the like. The drying agent can be put in a place before or after the flexible printed substrate is bonded. Alternatively, the drying agent may be placed in a flexible film of the flexible printed substrate before bonding the flexible printed substrate. The location of the drying agent is preferably the vicinity of the point of vacuum press-fitting of the plastic film.

In this specification, an OLED panel is not finished until its OLED is sealed with a plastic film. However, the term OLED panel may refer to one before plastic film sealing.

BRIEF DESCRIPTION OF THE DRAWINGS

In the accompanying drawings.

DETAILED DESCRIPTION OF THE PREFERRED EMBODIMENTS

Embodiment Mode

First, an a flexible printed circuit (FPC) 103 for supplying a voltage of a power supply and various kinds of signals is mounted to an OLED panel 101 that has a plastic substrate. A drying agent 104 is provided for preventing the OLED from being degraded by oxygen, moisture, and the like. The drying agent 104 is a hygroscopic substance (preferably barium oxide) or a substance that can adsorb oxygen. Here, the drying agent 104 is placed in a position that brings the drying agent to a contact with the FPC 103 and with an end face of the substrate 101. This prevents a sealing film and a plastic film from being locally stretched and broken in a later vacuum press-fit step.

Figure 1A:
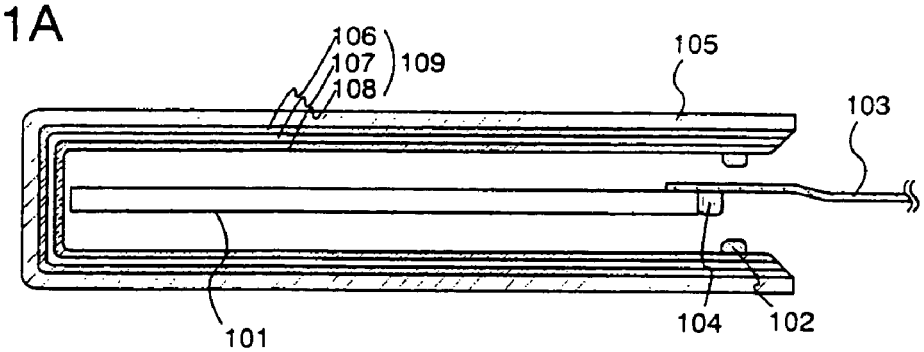
FIGS. 1A to 1C are diagrams of a light-emitting device of the present invention with FIGS. 1A and 1B showing sectional views thereof and FIG. 1C showing a top view thereof.

Next, the OLED panel 101 and the drying agent 104 are together put in a bag-like plastic film 105. The inside of the bag-like plastic film is lined with a sealing film 109 and the sealing film 109 acts as a gas barrier. At this point, the portion at which the OLED panel 101 is connected to the FPC 103 is placed inside the bag-like plastic film 105 (FIG. 1A).

The sealing film 109 is composed of two or more layers of inorganic insulating films and an organic insulating film that is interposed between the inorganic insulating films. The inorganic insulating films are insulating films of an inorganic material that can prevent transmission of moisture and oxygen. The organic insulating film is an insulating film of an organic material that is smaller in internal stress than the material of the inorganic insulating films.

For example, the sealing film 109 in this embodiment mode is an inorganic insulating film 106 that is in contact with the plastic film 105, an organic insulating film 107 that is in contact with the inorganic insulating film 106, and an inorganic insulating film 108 that is in contact with the organic insulating film 107.

It is sufficient that at least two layers of inorganic insulating films are provided. Examples of the usable inorganic insulating films include a silicon nitride film, a silicon oxynitride film, an aluminum oxide film, an aluminum nitride film, an aluminum oxynitride film, and an aluminum silicon oxynitride film (AlSiON). An aluminum silicon oxynitride film has relatively high heat conductivity and therefore can efficiently release heat generated in the element when used for the inorganic insulating films.

The inorganic insulating films are desirably 50 nm to 3 μm in thickness. The method of forming the inorganic insulating films is not limited to only plasma CVD, but can be chosen to suit individual cases. For instance, LPCVD, sputtering or the like may be employed to form the inorganic insulating films.

The material used for the organic insulating film has to be one which is transmissive of light, which can make the internal stress of the organic insulating film smaller than that of the inorganic insulating films, and which gives the organic insulating film a heat resistance high enough to withstand heat treatment in a later step. Typical examples of the organic insulating film material include polyimide, acrylic, polyamide, polyimideamide, benzocyclobutene, and an epoxy resin. Other resins than those given in the above may be used.

The organic insulating film is desirably 200 nm to 2 μm in thickness.

The bag-like plastic film 105 is exhausted until it reaches vacuum and then the mouth of the plastic film is sealed by an adhesive 102. The OLED panel 101 is thus sealed in the bag-like plastic film 105 while surrounded by the sealing film 109. The FPC 103 partially sticks out of the bag-like plastic film 105 in order to supply a voltage of a power supply and various kinds of signals.

Figure 1B:
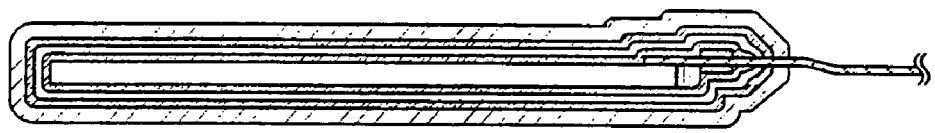
Figure 1C:
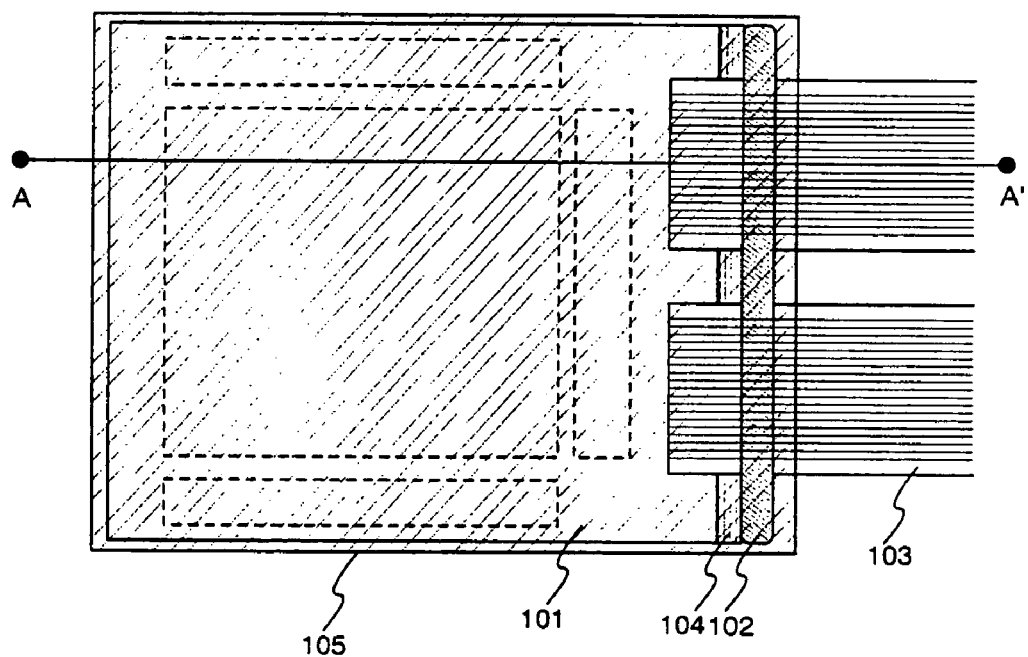

FIG. 1B shows a sectional view of the light-emitting device after the vacuum press-fitting and FIG. 1C shows a top view thereof. FIG. 1B corresponds to the sectional view taken along the line A–A' in FIG. 1C. The plastic film 105 and the sealing film 109 have to be transparent or translucent to visible light. The plastic film 105 can use any material as long as it is suitable for vacuum press-fitting.

This embodiment uses an adhesive to seal the plastic film. Alternatively, the inside of the plastic film may have partially a region that is not lined with the sealing film so that the plastic film is sealed by thermal press-fitting at this region. After the thermal press-fitting, an adhesive may be used in the press-fit portion in order to enhance the sealing. The film material is preferably one that is also bonded to a flexible tape of the FPC during the thermal press-fitting.

The material of the plastic film is a thermoplastic resin material (polyester, polypropylene, polyvinyl chloride, polyvinyl fluoride, polystyrene, polyacrylonitrile, polyethylene terephthalate, nylon, etc.). Typically, a PVF (polyvinyl fluoride) film, a Mylar film, or an acrylic resin film is used.

The plastic film used here is shaped like a bag or box. Alternatively, the plastic film may be two sheets which are superposed on one another and sealed on four sides by an adhesive or thermal press-fitting.

Desirably, the above steps are carried out after the OLED is formed on the substrate while avoiding exposure of the OLED to the outside air as much as possible.

In this way the present invention provides a light-emitting device with an OLED formed on a substrate in which degradation by moisture oxygen and the like is reduced to improve the reliability.

Embodiments of the present invention will be described below.

Embodiment 1

A method of forming a sealing film in a bag-like plastic film will be described in this embodiment.

Figure 2:
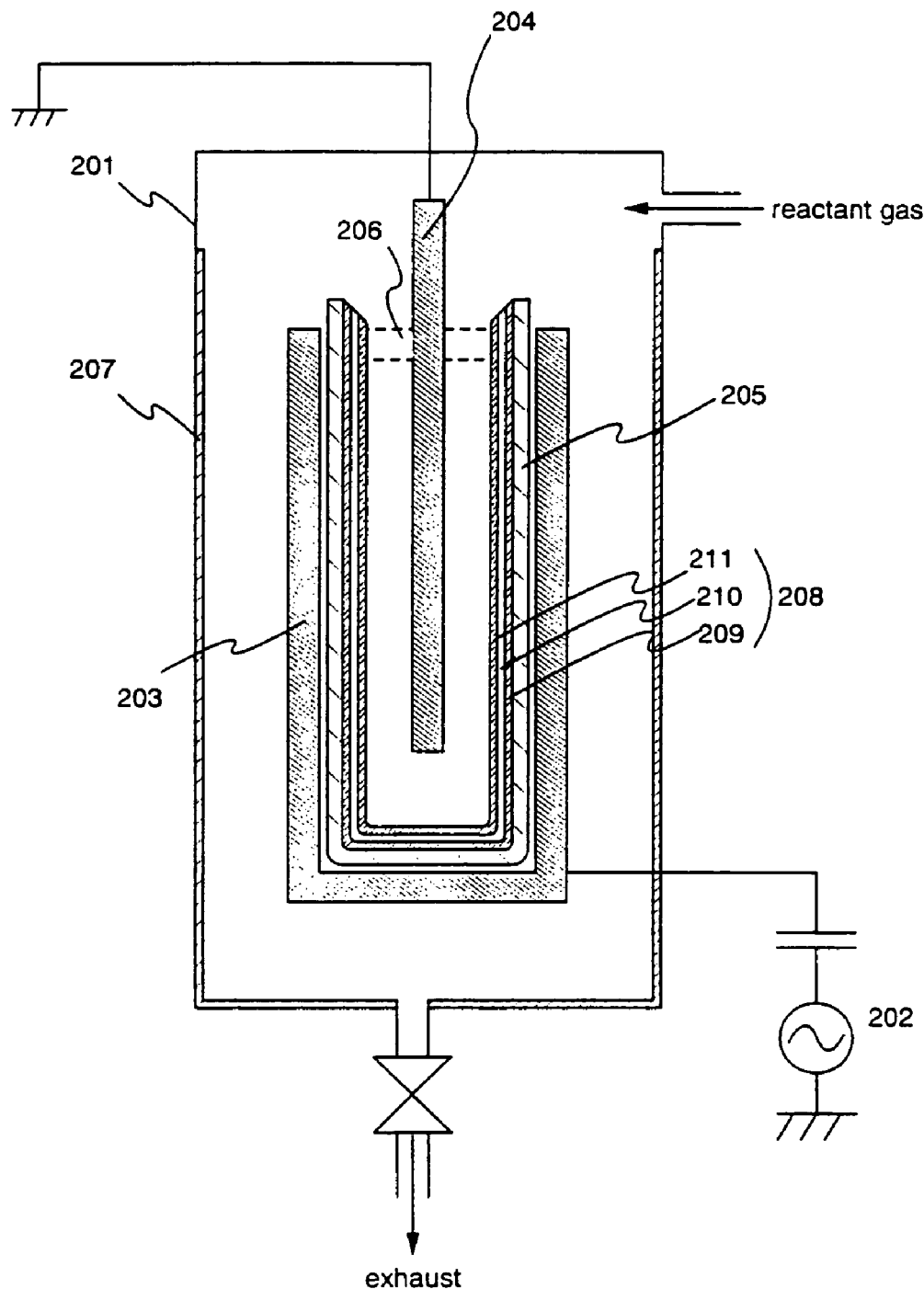
FIG. 2 is a diagram showing apparatus for forming a sealing film.

FIG. 2 shows the structure of apparatus for forming a sealing film by plasma CVD. An electrode 203 connected to an RF power supply 202 and an electrode 204 grounded are provided in a chamber 201.

The electrode 203 is placed so as to cover the outside of a bag-like plastic film 205. The electrode 204 is placed inside the bag-like plastic film 205. It is essential that the distance between the electrode 203 and the plastic film 205 and the distance between the electrode 204 and the plastic film 205 are set such that a sealing film is positively formed on the inside of the plastic film 205 than on the outside. Specifically, the distance between the electrode 203 and the plastic film 205 is set longer than the distance between the electrode 204 and the plastic film 205. Desirably, the distance between the electrode 203 and the plastic film 205 is equal to or more than 3 mm, more desirably, equal to or more than 10 mm.

The plastic film 205 is held by a holder 206 to a fixed position. The holder 206 is structured so as to prevent the mouth of the bag-like plastic film 205 from closing.

If the inside of the plastic film 205 is closely in contact with the holder 206 partially during formation of the sealing film, a region where the sealing film is not formed and the plastic film is exposed can be formed on the inside of the plastic film 205. At the region where the plastic film is exposed, the plastic film is press-fit thermally when the OLED panel is sealed by thermal press-fitting.

This embodiment describes a case of forming, on the inside of the plastic film 205, a sealing film 208 composed of two or more layers of inorganic insulating films and an organic insulating film that is interposed between the inorganic insulating films.

The inorganic insulating films used are insulating films which contain an inorganic material and which are capable of preventing transmission of oxygen and moisture. The organic insulating film used is an insulating film which contains an organic material having internal stress smaller than that of the inorganic insulating films. Specifically, this embodiment uses a silicon oxynitride film for an inorganic insulating film 209, a polyethylene film for an organic insulating film 210, and a silicon oxynitride film for an inorganic insulating film 211. The inorganic insulating film 209 is in contact with the plastic film 205 formed of PET. The organic insulating film 210 is in contact with the inorganic insulating film 209. The inorganic insulating film 211 is in contact with the organic insulating film 210.

The materials of the plastic film and the inorganic insulating films are not limited to the ones given in the above. The materials of the plastic film and the inorganic insulating films can be chosen freely from the materials listed in Embodiment Mode. However, this embodiment employs plasma CVD to form the sealing film and therefore materials that can be formed into films by plasma CVD should be used for the inorganic insulating films.

The material of the organic insulating film is not limited to polyethylene. The material that can be used for the organic insulating film has to be capable of forming an organic insulating film that is transmissive of light, smaller in internal stress than the inorganic insulating films, and can withstand heat treatment in a later step. However, this embodiment employs plasma CVD to form the sealing film and therefore it is essential that the material of the organic insulating film has to be one that can be formed into a film by plasma CVD. Examples of the usable organic insulating film material include polyethylene, polytetrafluoroethylene, polystyrene, benzocyclobutene, poly(p-phenylene vinylene), polyvinyl chloride, and a polyparaxylene-based resin.

First, the chamber 201 is exhausted till it reaches vacuum. Then $SiH_4$, $NH_3$, and $N_2O$ are introduced as reaction gas into the chamber 201 and a silicon oxynitride film is formed as the inorganic insulating film 209 by plasma CVD.

Next, the chamber 201 is again exhausted till it reaches vacuum and ethylene is introduced as reaction gas into the chamber 201 to form a polyethylene film as the organic insulating film 210 by plasma CVD.

After the chamber 201 is exhausted till it reaches vacuum once more, $SiH_4$, $NH_3$, and $N_2O$ are introduced as reaction gas into the chamber 201 and a silicon oxynitride film is formed as the inorganic insulating film 211 by plasma CVD.

If a protective insulating film 207 is formed on the inner wall of the chamber 201 in advance deposition of the sealing film materials on the inner wall can be avoided and most of the materials can be formed into the sealing film 208 on the plastic film 205.

This embodiment employs plasma CVD to form the sealing film 208, but the method of forming the sealing film is not limited thereto. For instance thermal CVD, evaporation, sputtering, or low pressure thermal CVD can be used to form the sealing film.

Embodiment 2

A method of sealing an OLED panel using a plastic film will be described in this embodiment.

Figure 3A:
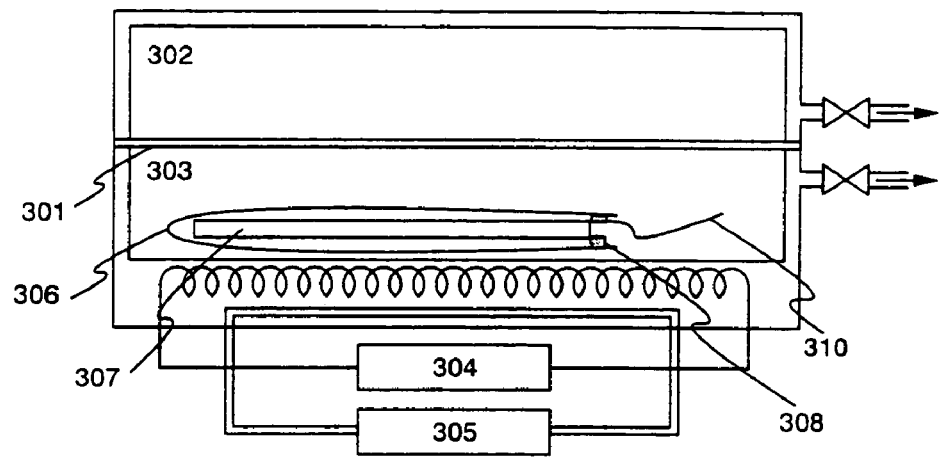
FIGS. 3A to 3C are diagrams illustrating a method of sealing a light-emitting device of the present invention.
Figure 3B:
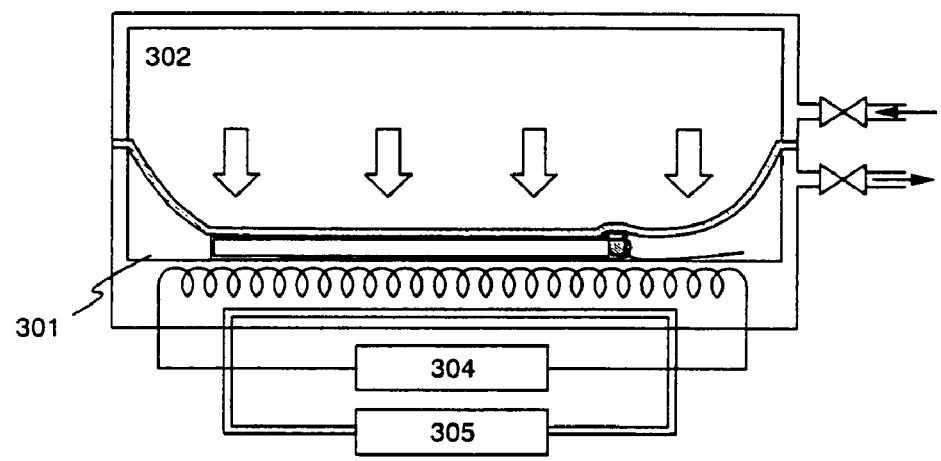
Figure 3C:
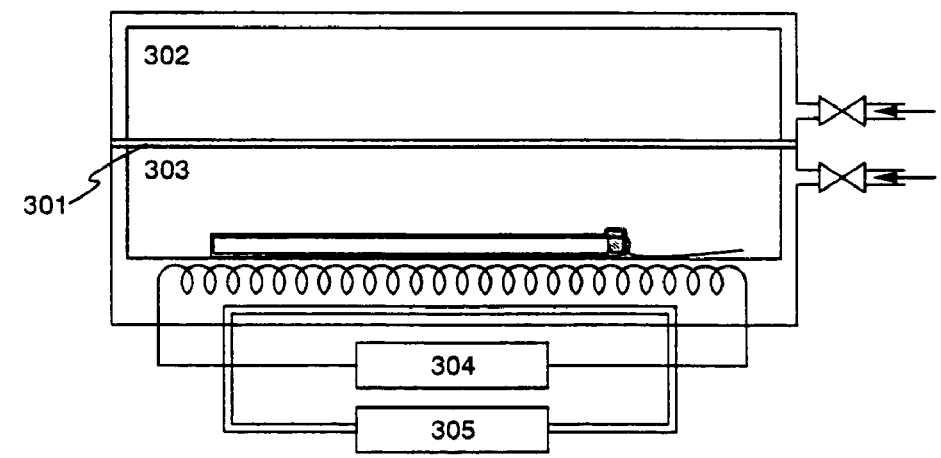

FIGS. 3A to 3C show the structure of apparatus for sealing an OLED panel in a bag-like plastic film (sealing apparatus). The sealing apparatus has two chambers, namely, a chamber A 302 and a chamber B 303, which are separated from each other by a partition film 301. The partition film 301 has elasticity and includes property of generating a force for correcting deformation even when it is distorted by an external force.

The chamber A 302 and the chamber B 303 each have an exhaust system. The chamber B 303 has a heater 304 and a cooler 305.

First, as shown in FIG. 3A, an OLED panel 307 is put in a bag-like plastic film 306 and the plastic film is placed in the chamber B 303. At this point, the OLED panel 307 has an FPC 310 mounted thereto and an adhesive 308 is placed near the mouth of the bag-like plastic film 306.

Next, the chamber A 302 and the chamber B 303 are exhausted until they reach vacuum and inert gas (Ar, in this embodiment) is then introduced to the chamber B 303. The chamber is again exhausted till it reaches vacuum to remove oxygen and moisture in the chamber B 303.

The heater 304 is used to melt the adhesive 308. The adhesive 308 used in this embodiment is a hot melt adhesive that obtains adhesion when heated and melted. Typically a hot melt adhesive using as the base ethylene-vinyl acetate copolymer or polyamide, or polyester, is employed.

While the adhesive 308 is melted by heat, the pressure in the chamber A 302 is increased by exposure to the air or other measures. This causes the chamber A 302 to depress the chamber B 303 as shown in FIG. 3B. As a result, the elastic partition film 301 presses the plastic film 306. The melted adhesive 308 is also pressed to seal the OLED panel 307 in vacuum in the bag-like plastic film 306.

In this state, the adhesive 308 is cooled by the cooler 305. The adhesive 308 is thus solidified with the OLED panel 307 sealed in vacuum in the bag-like plastic film 306.

Next, as shown in FIG. 3C, the pressure in the chamber B 303 is increased to put a distance between the partition film 301 and the sealed OLED panel 307.

The OLED panel 307 can be sealed in vacuum in the bag-like plastic film by the method described above.

The method of sealing the OLED panel is not limited to the one shown in this embodiment.

This embodiment may be freely combined with Embodiment 1.

Embodiment 3

In this Embodiment, fabrication method of OLED panel in which includes OLED formed on the plastic substrate is described. FIGS. 4 and 5 is the cross sectional view of fabrication steps of pixel portion and driving circuit.

Figure 4A:
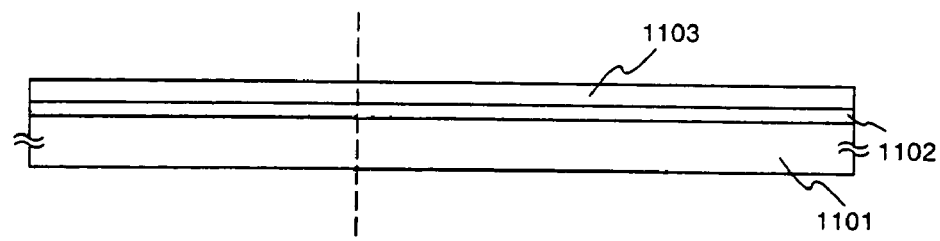
FIGS. 4A to 4C are diagrams showing a method of manufacturing a light-emitting device according to the present invention.

In FIG. 4A, a first bonding layer 1102 made of an amorphous silicon film is formed to have a thickness of 100 to 500 nm (300 nm in this embodiment) on a first substrate 1101. Although a glass substrate is used as the first substrate 1101 in this embodiment, a quartz substrate, a silicon substrate, a metal substrate or a ceramic substrate may be alternatively used. Any material can be used for the first substrate 1101 as long as it is resistant to a treatment temperature in the later manufacturing steps.

As a method of forming the first bonding layer 1102 a low pressure thermal CVD method, a plasma CVD method, a sputtering method or an evaporation method may be used. On the first bonding layer 1102, an insulating film 1103 made of a silicon oxide film is formed to have a thickness of 200 nm. As a method of forming the insulating film 1103, a low pressure thermal CVD method, a plasma CVD method, a sputtering method or an evaporation method may be used. The insulating film 1103 serves to protect an element formed on the first substrate 1101 when the first bonding layer 1102 is removed to peel off the first substrate 1101.

Figure 4B:
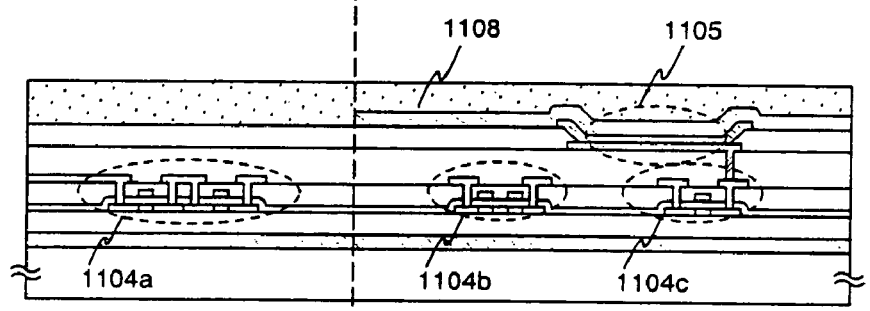

Next, an element is formed on the insulating film 1103 (FIG. 4B). The element herein designates a semiconductor element (typically, a TFT) or an MIM element, which is used as a switching element for a pixel, an OLED and the like in the case of an active matrix light-emitting device. In the case of a passive light-emitting device, the element designates an OLED. In FIG. 4B, a TFT 1104a in a driving circuit 1106. TFTs 1104b and 1104c and an OLED 1105 in a pixel portion 1107 are shown as representative elements.

Then, an insulating film 1108 is formed so as to cover the above-described elements. It is preferred that the insulating film 1108 has a flatter surface after its formation. It is not necessarily required to provide the insulating film 1108.

Figure 4C:
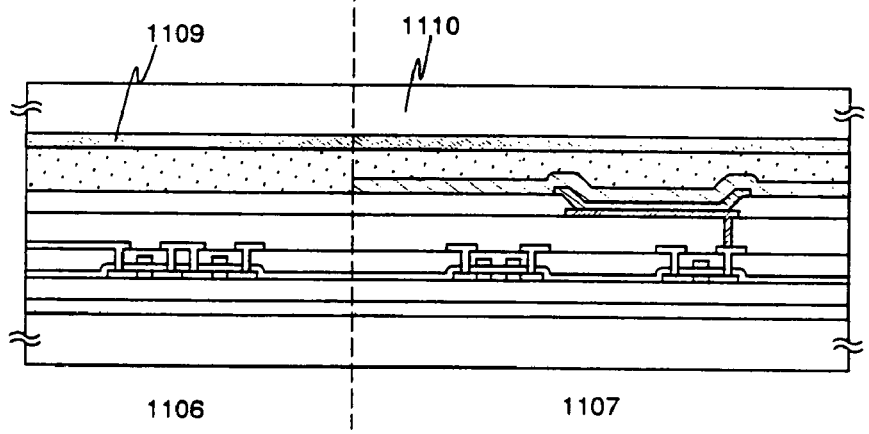

Next, as shown in FIG. 4C, a second substrate 1110 is bonded through a second bonding layer 1109. In this embodiment, a plastic substrate is used as the second substrate 1110. More specifically, a resin substrate having a thickness of 10 μm or more, for example, a substrate made of PES (polyether sulfone), PC (polycarbonate), PET (polyethylene terephthalate) or PEN (polyethylene naphthalate) can be used.

As a material of the second bonding layer 1109, it is necessary to use such a material that can provide a high selection ratio when the first bonding layer 1102 is to be removed in the later step. Typically, an insulating film made of a resin can be used as the second bonding layer 1109. Although polyimide is used as a material of the second bonding layer 1109 in this embodiment mode, acryl, polyamide or an epoxy resin can be alternatively used. In the case where the second bonding layer 1109 is placed on the viewer side (the side of a light-emitting device user) when seen from the OLED, a material is required to have light transmittance.

Figure 5A:
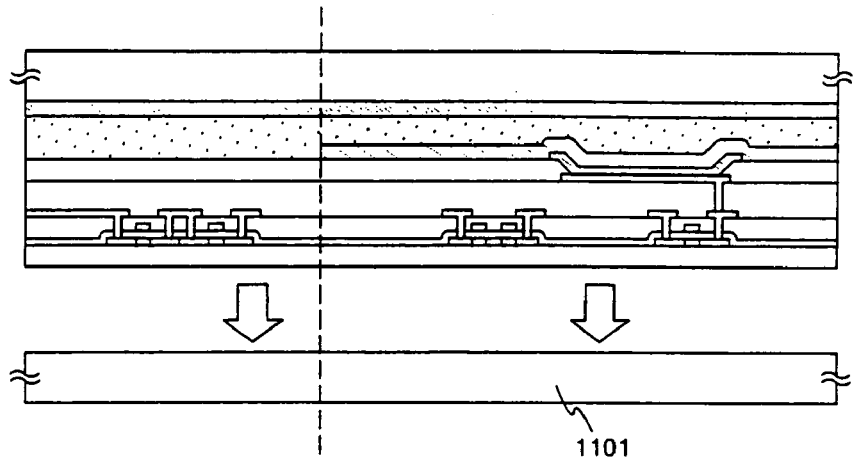
FIGS. 5A to 5C are diagrams showing a method of manufacturing a light-emitting device according to the present invention.

Next, as shown in FIG. 5A, the first substrate 1101, the second substrate 1110 and all the elements and the entire films formed therebetween are exposed to a gas containing halogen fluoride so as to remove the first bonding layer 1102. In this embodiment, chlorine trifluoride ($ClF_3$) is used as halogen fluoride, and nitrogen is used as a diluent gas. Alternatively, argon, helium or neon may be used as a diluent gas. A flow rate may be set to 500 sccm ($8.35 \times 10^{-6}$ m$^3$/s) for both gases, and a reaction pressure may be set to 1 to 10 Torr ($1.3 \times 10^2$ to $1.3 \times 10^3$ Pa). A treatment temperature may be a room temperature (typically, 20 to 27° C.).

In this case, the silicon film is etched whereas the plastic film, the glass substrate, the polyimide film, and the silicon oxide film are not etched. More specifically, through exposure to chlorine trifluoride, the first bonding layer 1102 is selectively etched to result in complete removal thereof. Since an active layer of the TFT, which is similarly made of a silicon layer, is not exposed to the outside, the active layer is not exposed to chlorine trifluoride and therefore is not etched.

In this embodiment mode, the first bonding layer 1102 is gradually etched from its exposed edge portions. The first substrate 1101 and the insulating film 1103 are separated from each other when the first bonding layer 1102 is completely removed. The TFTs and the OLED, each of which includes a laminate of thin films, remain on the second substrate 1110.

A large-sized substrate is not preferred as the first substrate 1101 because the etching gradually proceeds from the edges of the first bonding layer 1102 and therefore the time required for completely removing the first bonding layer 1102 gets long with increase in size. Therefore, it is desirable that this embodiment mode is carried out for the first substrate 1101 having a diagonal of 3 inches or less (preferably, 1 inch or less).

Figure 5B:
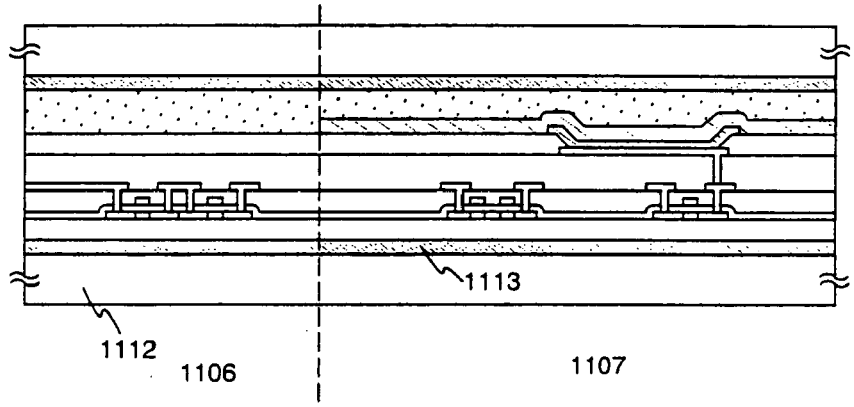

After the peeling of the first substrate 1101 in this manner a third bonding layer 1113 is formed as shown in FIG. 5B. Then, a third substrate 1112 is bonded through the third bonding layer 1113. In this embodiment a plastic substrate is used as the third substrate 1110. More specifically, a resin substrate having a thickness of 10 μm or more, for example, a substrate made of PES (polyether sulfone), PC (polycarbonate), PET (polyethylene terephthalate) or PEN (polyethylene naphthalate) can be used as the third substrate.

As the third bonding layer 1113, an insulating film made of a resin (typically, polyimide, acryl, polyamide or an epoxy resin) can be used. In the case where the third bonding layer 1113 is placed on the viewer side (the side of a light-emitting device user) when seen from the OLED, a material is required to have light transmittance.

In this manner, a flexible OLED panel (light-emitting device) interposed between the two flexible substrates 1110 and 1112 having flexibility can be obtained. With use of the same material for the second substrate 1110 and the third substrate 1112, the substrates 1110 and 1112 have the same thermal expansion coefficient. As a result, the substrates 1110 and 1112 can be hardly affected by a stress strain due to change in temperature.

Figure 5C:
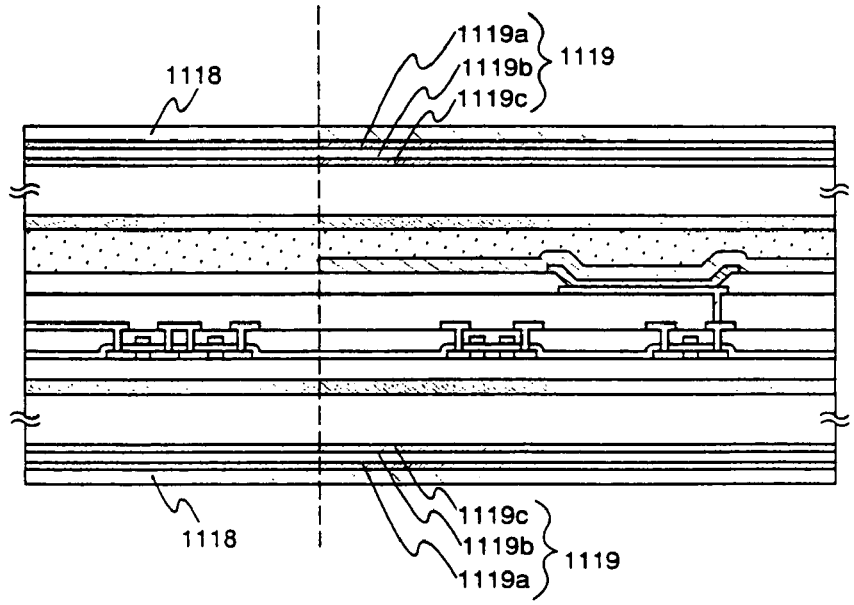

Next, as shown in FIG. 5C, OLED panel is sealed with a plastic film 1118 on which a sealing film 1119 is formed. At that time, the sealing film 1119 is placed between the plastic film 1118 and OLED 1105.

In this embodiment, as the sealing film 1119, inorganic insulating film 1119a, organic insulating film 1119b, inorganic insulating film 1119c are formed with the order near the plastic film 1118.

The light-emitting device manufactured according to this embodiment allows the manufacture of an element using a semiconductor (for example, a TFT) without being limited by a heat resistance of the plastic substrate. Thus the light-emitting device having extremely high performance can be obtained.

Although the first bonding layer 1102 is made of amorphous silicon and is removed with a gas containing halogen fluoride in this embodiment the present invention is not limited to this structure. A material and a removal method of the first bonding layer 1102 can be suitably determined by those who carry out the invention. It is important to determine a material and a removal method of the first bonding layer so that the substrates, the elements and the films other than the first bonding layer, which are not desired to be removed, are not removed with removal of the first bonding layer so as not to affect the operation of the light-emitting device. It is also important that a material of the first bonding layer does not allow its removal in the process other than in the removal step of the first bonding layer.

For example, an organic material, which is entirely or partially vaporized by radiation of a laser beam, can be used as the first bonding layer. Additionally it is desirable that a material having laser beam absorbance, for example, a colored or black material (for example, a resin material containing a black colorant) is used so that a laser beam is efficiently absorbed only by the first bonding layer in the case where a second harmonic wave from a YAG laser is used. A material, which is not vaporized in a heat treatment in the element formation steps, is used for the first bonding layer.

Each of the first, second and third bonding layers may be either single-layered or multi-layered. An amorphous silicon film or a DLC film may be provided between the bonding layer and the substrate.

The first bonding layer may be formed of an amorphous silicon film, and the first substrate may be peeled off by radiation of a laser beam onto the first bonding layer in the later step. In this case, in order to facilitate the peeling of the first substrate, it is preferred to use an amorphous silicon film containing a large amount of hydrogen. Hydrogen contained in the amorphous silicon film is vaporized by radiation of a laser beam, so that the first substrate can be easily peeled off.

As a laser beam, a pulse oscillation or a continuous wave excimer laser, a YAG laser or a $YVO_4$ laser can be used. A laser beam is radiated onto the first bonding layer through the first substrate so as to vaporize only the first bonding layer to peel off the first substrate. Therefore, as the first substrate, it is preferred to use a substrate through which at least a radiated laser beam is allowed to pass, typically a substrate having light transmittance, for example, a glass substrate, a quartz substrate or the like, which has a thickness larger than those of the second and third substrates.

In the present invention, in order to allow a laser beam to pass through the first substrate, it is necessary to suitably select the type of a laser beam and the first substrate. For example, when a quartz substrate is used as the first substrate, a YAG laser (fundamental wave (1064 nm), a second harmonic wave (532 nm), a third harmonic wave (355 nm), and a fourth harmonic wave (266 nm) ) or an excimer laser (wavelength: 308 nm) is used to form a linear beam which is in turn allowed to pass through the quartz substrate. It is noticed that an excimer laser beam does not pass through a glass substrate. Therefore, when a glass substrate is used as the first substrate, a fundamental wave, a second harmonic wave or a third harmonic wave of the YAG laser, preferably, a second harmonic wave (wavelength: 532 nm), is used to form a linear beam which is in turn allowed to pass through the glass substrate.

Alternatively, for example, a method of separating the first substrate by spraying a fluid (a pressure-applied liquid or gas) on the first bonding layer (typically, a water jet method) may be used.

In the case where the first bonding layer is made of an amorphous silicon film, the first bonding layer may be removed by using hydrazine.

Alternatively, a method of separating the first substrate by etching, described in a U.S. Pat. No. 5,821,138 may be employed. Specifically, an applied silicon oxide film (SOG) may be used as the first bonding layer which is then removed by hydrogen fluoride. In this case, it is important that the silicon oxide film, which is not desired to be removed, is formed to have a fine structure through a sputtering or a CVD method so that the silicon oxide film provides a high selection ratio when the first bonding layer is to be removed by hydrogen fluoride.

With such a structure, even if substrates having an extremely small thickness, specifically, 50 to 300 µm, preferably 150 to 200 µm, are used as the second and third substrates, a light-emitting device with high reliability can be obtained. It was difficult to form an element on such a thin substrate by using a conventionally known manufacture apparatus. However, since the element is formed with being bonded onto the first substrate, a manufacture apparatus using a thick substrate can be used without any alteration of the apparatus.

With the use of the sealing film including the multi-layered insulating film, it is possible to effectively restrain the degradation due to penetration of moisture or oxygen. Moreover, a crack is prevented from occurring upon bend of the substrate. As a result, a light-emitting device having enhanced flexibility can be realized.

Note that it is possible to implement Embodiment 3 in combination with Embodiments 1 to 2.

Embodiment 4

In this Embodiment, different way from embodiment 3 of fabrication method of OLED panel in which includes OLED formed on the plastic substrate is described. FIGS. 6 and 7 is the cross sectional view of fabrication steps of pixel portion and driving circuit.

Figure 6A:
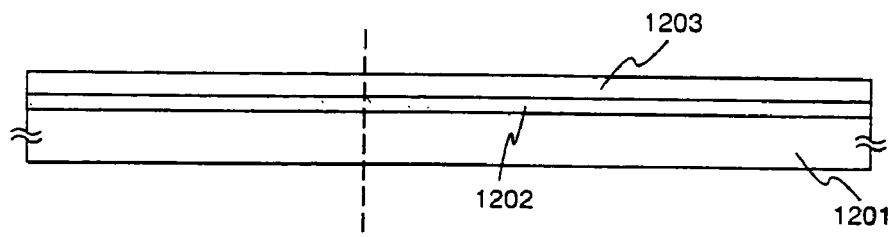
FIGS. 6A to 6D are diagrams showing a method of manufacturing a light-emitting device according to the present invention.

In FIG. 6A, a first bonding layer 1202 made of an amorphous silicon film is formed to have a thickness of 100 to 500 nm (300 nm in this embodiment mode) is formed on a first substrate 1201. Although a glass substrate is used as the first substrate 1201 in this embodiment mode, a quartz substrate, a silicon substrate, a metal substrate or a ceramic substrate may be alternatively used. Any material can be used for the first substrate 1201 as long as it is resistant to a treatment temperature in the later manufacture steps.

As a method of forming the first bonding layer 1202 a low pressure thermal CVD method, a plasma CVD method, a sputtering method or an evaporation method may be used. On the first bonding layer 1202, an insulating film 1203 made of a silicon oxide film is formed to have a thickness of 200 nm. As a method of forming the insulating film 1203, a low pressure thermal CVD method, a plasma CVD method, a sputtering method or an evaporation method may be employed. The insulating film 1203 serves to protect an element formed on the first substrate 1201 when the first bonding layer 1202 is removed to peel off the first substrate 1201.

Figure 6B:
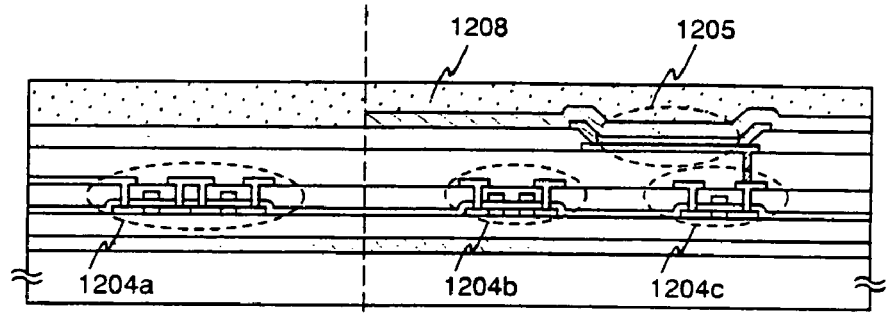

Next, an element is formed on the insulating film 1203 (FIG. 6B). The element herein designates a semiconductor element (typically, a TFT) or an MIM element, which is used as a switching element for a pixel, and an OLED and the like in the case of an active matrix light-emitting device. In the case of a passive light-emitting device, the element designates an OLED. In FIG. 6B, a TFT 1204a in a driving circuit 1206, TFTs 1204b and 1204c and an OLED 1205 in a pixel portion are shown as representative elements.

Then, an insulating film 1208 is formed so as to cover the above-described elements. It is preferred that the insulating film 1208 has a flatter surface after its formation. It is not necessarily required to provide the insulating film 1208.

Figure 6C:
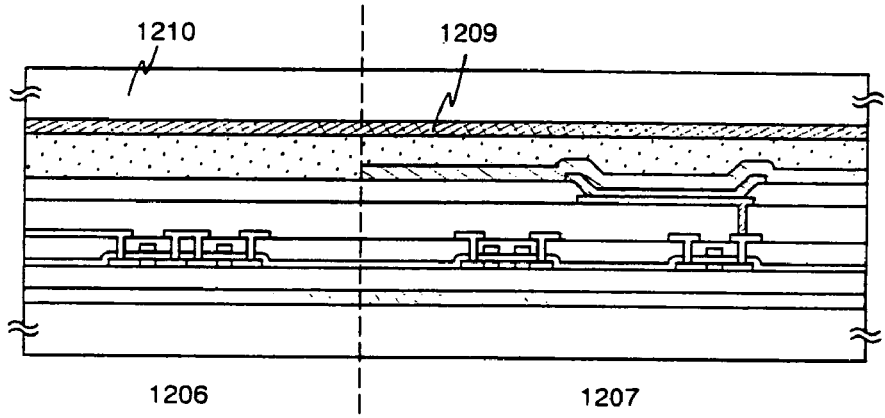

Next, as shown in FIG. 6C, a second substrate 1210 is bonded to the first substrate 1201 through a second bonding layer 1209. Although a glass substrate is used as the second substrate 1210 in this embodiment mode, a quartz substrate, a silicon substrate, a metal substrate or a ceramic substrate may also be used. Any material may be used for the second substrate 1210 as long as the material is resistant to a treatment temperature in the later manufacture step.

As a material of the second bonding layer 1209, it is necessary to use a material which can provide a high selection ratio when the first bonding layer 1202 is to be removed in the later step. Furthermore, for the second bonding layer 1209, it is required to use such a material that a third bonding layer serving to bond a third substrate is not removed with the removal of the second bonding layer and does not cause the peeling of the third substrate. In this embodiment, a polyamic acid solution which is a precursor of a polyimide resin, described in Japanese Patent Application Laid-open No. Hei 5-315630, is used. Specifically, after the second bonding layer 1209 is formed to have a thickness of 10 to 15 µm using a polyamic acid solution, which is an uncured resin, the second substrate 1210 and the interlayer insulating film 1208 are bonded to each other through thermocompression bonding. Then, heating is conducted so as to temporarily cure the resin.

In this embodiment, a material of the second bonding layer is not limited to a polyamic acid solution. Any material may be used as long as it provides a high selection ratio when the first bonding layer 1202 is to be removed in the later step and the third bonding layer for bonding the third substrate is not removed with the removal of the second bonding layer and does not cause the peeling of the third substrate. It is important that the second bonding layer is made of such a material that is not removed in the steps other than the step of removing the second bonding layer.

Figure 6D:
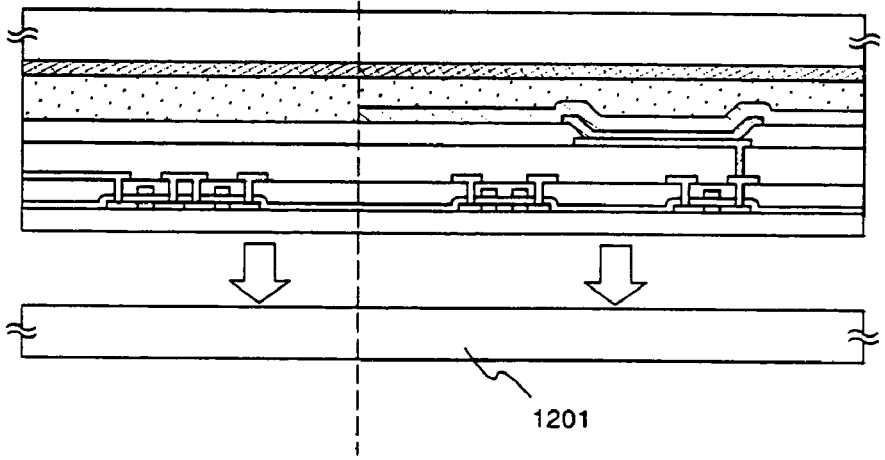

Next, as shown in FIG. 6D, the first substrate 1201, the second substrate 1210 and all the elements and the entire films formed therebetween are exposed to a gas containing halogen fluoride so as to remove the first bonding layer 1202. In this embodiment, chlorine trifluoride ($ClF_3$) is used as halogen fluoride, and nitrogen is used as a diluent gas. Alternatively, argon, helium or neon may be used as a diluent gas. A flow rate for both gases may be set to 500 sccm ($8.35 \times 10^{-6}$ m$^3$/s), and a reaction pressure may be set to 1 to 10 Torr ($1.3 \times 10^2$ to $1.3 \times 10^3$ Pa). A treatment temperature may be a room temperature (typically, 20 to 27° C.).

In this case, the silicon film is etched whereas the plastic film, the glass substrate, the polyimide film, and the silicon oxide film are not etched. More specifically, through exposure to a chlorine trifluoride gas, the first bonding layer 1202 is selectively etched to result in complete removal thereof. Since an active layer of the TFT, which is similarly made of a silicon film, is not exposed to the outside, the active layer is not exposed to a chlorine trifluoride gas and therefore is not etched.

In this embodiment, the first bonding layer 1202 is gradually etched from its exposed edge portions. The first substrate 1201 and the insulating film 1203 are separated from each other when the first bonding layer 1202 is completely removed. After removal of the first bonding layer 1202, the TFTs and the OLED, each of which includes a laminate of thin films remain on the second substrate 1210.

A large substrate is not preferred as the first substrate 1201 because the first bonding layer 1202 is gradually etched from its edges and the time required for completely removing the first bonding layer 1202 gets long with increase in size. Therefore, it is desirable that this embodiment is carried out for the first substrate 1201 having a diagonal of 3 inches or less (preferably, 1 inch or less).

Figure 7A:
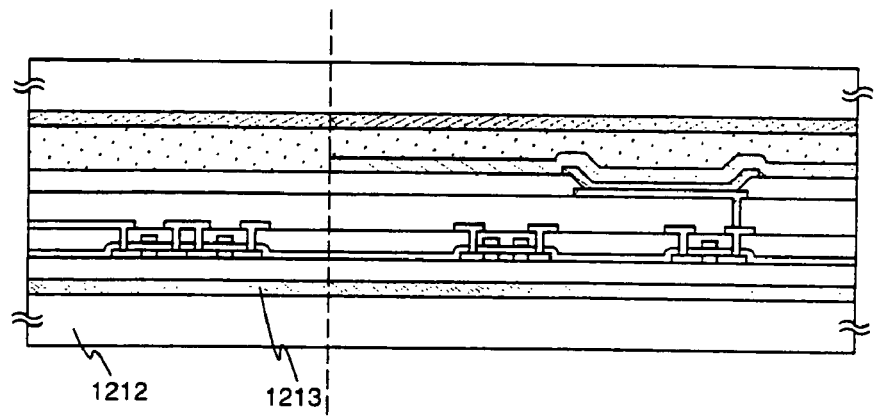
FIGS. 7A to 7C are diagrams showing a method of manufacturing a light-emitting device according to the present invention.

After removal of the first substrate 1201 in this manner a third bonding layer 1213 is formed as shown in FIG. 7A. Then, a third substrate 1212 is bonded to the second substrate 1210 through the third bonding layer 1213. In this embodiment, a plastic substrate is used as the third substrate 1210. More specifically, a resin substrate having a thickness of 10 µm or more, for example, a substrate made of PES (polyether sulfone), PC (polycarbonate), PET (polyethylene terephthalate) or PEN (polyethylene naphthalate) can be used as the third substrate.

An insulating film made of a resin (typically, polyimide, acryl, polyamide or an epoxy resin) can be used as the third bonding layer 1213. In the case where the third bonding layer 1213 is placed on the viewer side (the side of a light-emitting device user) when seen from the OLED, a material is required to have light transmittance.

Figure 7B:
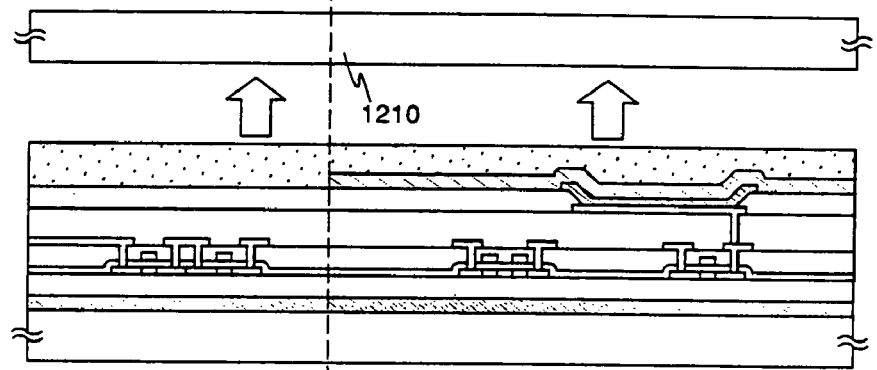

Next, as shown in FIG. 7B, the second bonding layer 1209 is removed to peel off the second substrate 1210. More specifically, the second bonding layer 1209 is removed by being dipped into water for about an hour, thereby allowing the second substrate 1210 to be peeled off.

It is important to select a method of peeling off the second bonding layer 1209 according to a material of the second bonding layer, a material of the element or the films, a material of the substrate, and the like.

In this manner, a flexible OLED panel (light-emitting device) using a single plastic substrate 1212 can be obtained.

Figure 7C:
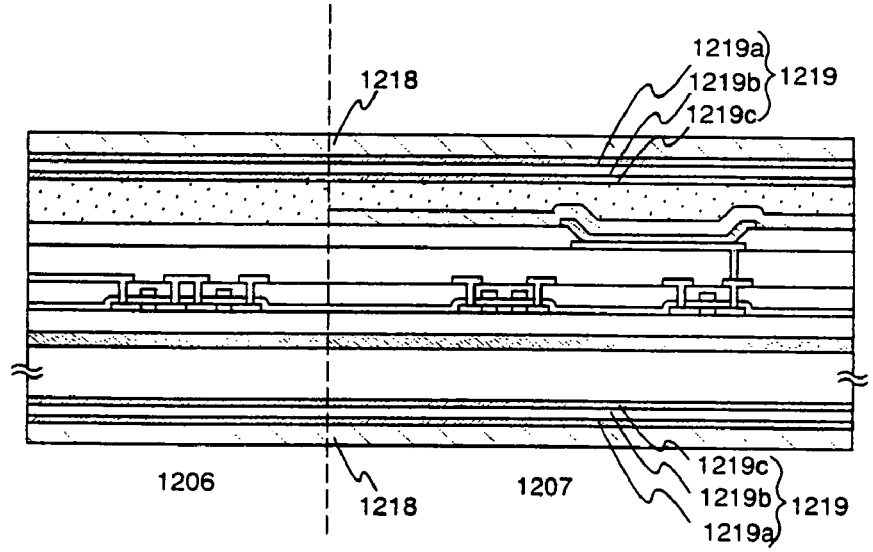

Next, as shown in FIG. 7C, OLED panel is sealed with a plastic film 1218 on which a sealing film 1219 is formed. At that time, the sealing film 1219 is placed between the plastic film 1218 and OLED 1205.

In this embodiment, as the sealing film 1219 inorganic insulating film 1219a, organic insulating film 1219b, inorganic insulating film 1219c are formed with the order near the plastic film 1218.

Since an element using a semiconductor (for example, a TFT) can be formed without being limited by a heat resistance of the plastic substrate, the light-emitting device having extremely high performance can be manufactured according to this embodiment.

Although the first bonding layer 1202 is made of amorphous silicon, and is removed with a gas containing halogen fluoride in this embodiment, the present invention is not limited to this structure. A material and a removal method of the first bonding layer can be suitably determined by those who carry out the invention. It is important to determine a material and a removal method of the first bonding layer so that the substrates, the other bonding layers, the elements and the films other than the first bonding layer, which are not desired to be removed, are not removed with removal of the first bonding layer so as not to affect the operation of the light-emitting device. It is also important that a material of the first bonding layer does not allow its removal in the process other than the removal step of the first bonding layer.

Although a polyamic acid solution, which is a precursor of a polyimide resin, is used for the second bonding layer 1209 which is then removed with water, the structure of the present invention is not limited thereto. A material and a removal method of the second bonding layer can be suitably determined by those who carry out the invention. It is important to determine a material and a removal method of the second bonding layer so that the substrates, the other bonding layers, the elements and the films other than the second bonding layer, which are not desired to be removed, are not removed with removal of the second bonding layer so as not to affect the operation of the light-emitting device. It is also important that a material of the second bonding layer does not allow its removal in the process other than the removal step of the second bonding layer.

For example, an organic material, which is entirely or partially vaporized by radiation of a laser beam, can be used for the first and second bonding layers. Additionally, it is desirable that a material having laser beam absorbance, for example, a colored or black material (for example, a resin material containing a black colorant) is used so that a laser beam is efficiently absorbed only by the first and second bonding layers in the case where a second harmonic wave from a YAG laser is used. The first and second bonding layers, which are not vaporized in a heat treatment in the element formation steps, are employed.

Each of the first, second and third bonding layers may be either single-layered or multi-layered. An amorphous silicon film or a DLC film may be provided between the bonding layer and the substrate.

The first bonding layer or the second bonding layer may be formed of an amorphous silicon film, and the substrate may be peeled off by radiation of a laser beam onto the first bonding layer or the second bonding layer in the later step. In this case, in order to facilitate the peeling of the first substrate, it is preferred to use an amorphous silicon film containing a large amount of hydrogen. Hydrogen contained in the amorphous silicon film is vaporized by radiation of a laser beam, so that the substrate can be easily peeled off.

As a laser beam, a pulse oscillation or a continuous wave excimer laser, a YAG laser or a YVO$_4$ laser can be used. In the case where the first substrate is to be peeled off, a laser beam is radiated onto the first bonding layer through the first substrate so as to vaporize only the first bonding layer to peel off the first substrate. In the case where the second substrate is to be peeled off, a laser beam is radiated onto the second bonding layer through the second substrate so as to vaporize only the second bonding layer to peel off the second substrate. Therefore, as the first or second substrate, it is preferred to use a substrate having a thickness larger than that of the third substrates, which allows at least a radiated laser beam to pass through, typically a substrate having light transmittance, for example, a glass substrate, a quartz substrate or the like.

In the present invention, in order to allow a laser beam to pass through the first or second substrate, it is necessary to suitably select the type of a laser beam and the type of the first substrate. For example, when a quartz substrate is used as the first substrate, a YAG laser (fundamental wave (1064 nm), a second harmonic wave (532 nm), a third harmonic wave (355 nm), and a fourth harmonic wave (266 nm)) or an excimer laser (wavelength: 308 nm) is used to form a linear beam which is in turn allowed to pass through the quartz substrate. It is noticed that an excimer laser beam does not passes through a glass substrate. Therefore, when a glass substrate is used, a fundamental wave, a second harmonic wave or a third harmonic wave of the YAG laser, preferably, a second harmonic wave (wavelength: 532 nm), is used to form a linear beam which is in turn allowed to pass through the glass substrate.

Alternatively, for example, a method of separating the first substrate by spraying a fluid (a pressure-applied liquid or gas) on the first bonding layer (typically, a water jet method) may be used.

In the case where the first bonding layer is made of an amorphous silicon film, the first bonding layer may be removed by using hydrazine.

Alternatively, a method of separating the first substrate by etching, described in a U.S. Pat. No. 5,821,138 may be used. Specifically, an applied silicon oxide film (SOG) may be used as the first or second bonding layer which is then removed by hydrogen fluoride. In this case, it is important that the silicon oxide film, which is not desired to be removed, is formed to have a fine structure through a sputtering or a CVD method so that the silicon oxide film provides a high selection ratio when the first or second bonding layer is to be removed by hydrogen fluoride.

With such a structure, even if a substrate having an extremely small thickness, specifically, 50 to 300 μm, preferably 150 to 200 μm is used as the third substrate, a light-emitting device with high reliability can be obtained. It is difficult to form an element on such a thin substrate by using a conventionally known manufacture apparatus. However, since the element is formed with being bonded onto the first and second substrates, a manufacturing apparatus using a thick substrate can be used without any alteration of the apparatus.

With the use of the sealing film including the multi-layered insulating film, it is possible to effectively restrain the degradation due to penetration of moisture or oxygen. Moreover, a crack is prevented from occurring upon bend of the substrate. As a result, a light-emitting device having enhanced flexibility can be realized.

In the first and second embodiment, either an anode or a cathode of the OLED may be used as a pixel electrode.

Note that it is possible to implement Embodiment 4 in combination with Embodiments 1 to 2.

Embodiment 5

In Embodiment 5, the outward appearance of a light-emitting device according to the present invention and its connection to an FPC will be described.

Figure 8A:
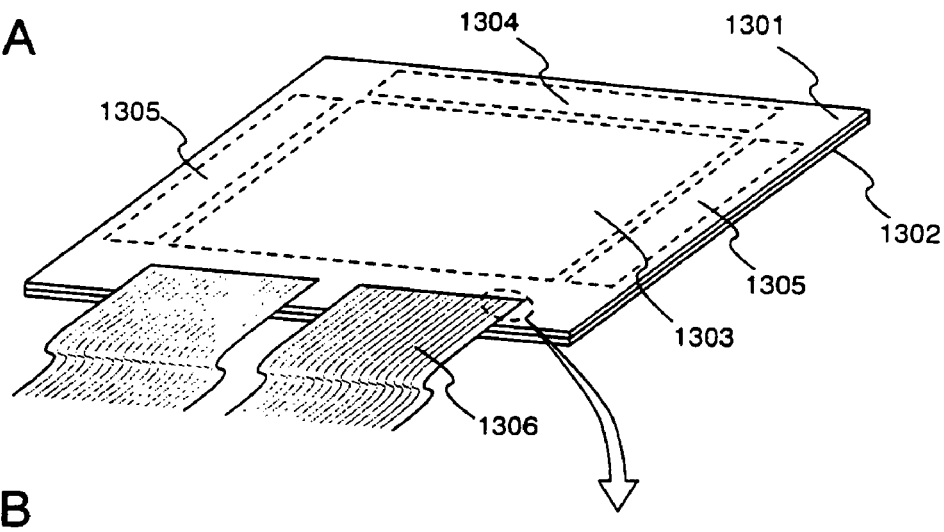
FIGS. 8A to 8C are diagrams of a light emitting device of the present invention before sealing with FIG. 8A showing the external thereof and FIGS. 8B and 8C showing an enlarged view and a sectional view of its connection portion at which the device is connected to an FPC.

FIG. 8A shows an example of a top view of a light-emitting device according to the present invention, described in Embodiment 3. A second substrate 1301 and a third substrate 1302 are both plastic substrates having flexibility. A pixel portion 1303 and driving circuits (a source-side driving circuit 1304 and a gate-side driving circuit 1305) are provided between the second substrate 1301 and the third substrate 1302.

In FIG. 8A, there is shown an example where the source-side driving circuit 1304 and the gate side-driving circuit 1305 are formed on the substrate on which the pixel portion 1303 is also formed. However, the driving circuits represented by the source-side driving circuit 1304 and the gate side-driving circuit 1305 may be formed on a different substrate from the substrate on which the pixel portion 1303 is formed. In this case, the driving circuits may be connected to the pixel portion 1303 via an FPC or the like.

The number and the arrangement of the source-side driving circuit 1304 and the gate-side driving circuit 1305 are not limited to the structure shown in FIG. 8A.

The reference symbol 1306 designates an FPC, via which a signal from an IC including a controller or a source voltage are supplied to the pixel portion 1303, the source-side driving circuit 1304 and the gate-side driving circuit 1305.

Figure 8B:
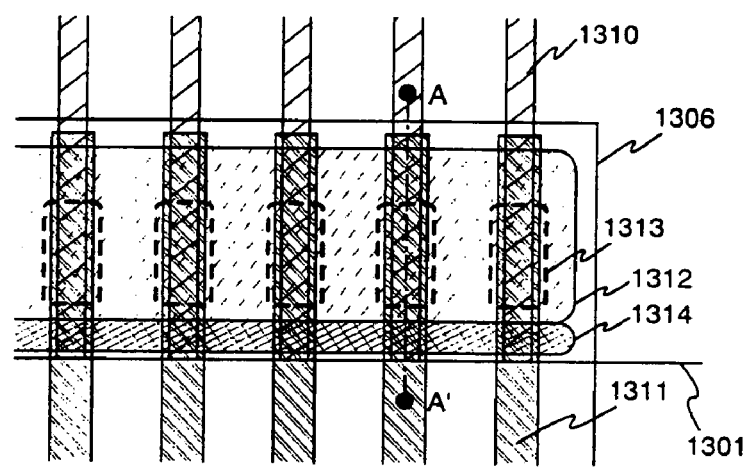
Figure 8C:
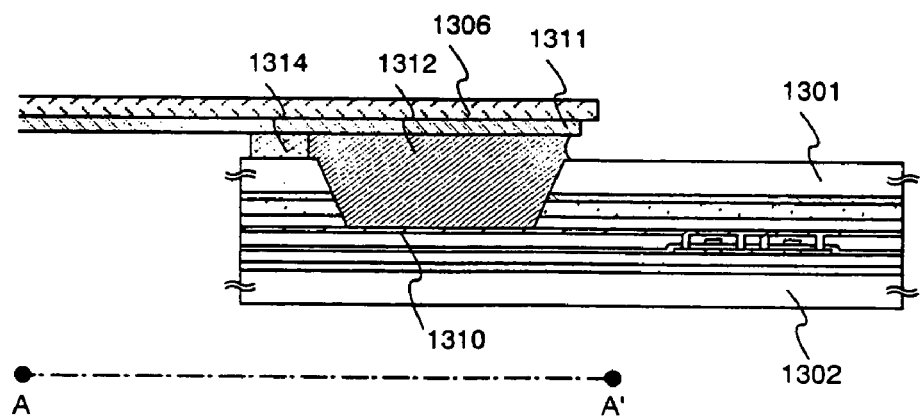

FIG. 8B is an enlarged view of a portion surrounded by a dot line in FIG. 8A where the FPC 1306 and the second substrate 1301 are connected to each other. FIG. 8C is a cross-sectional view taken along a line A–A' in FIG. 8B.

Wirings 1310, which are extended so as to supply a signal or a source voltage to the pixel portion 1303, the source-side driving circuit 1304 and the gate-side driving circuit 1305, are provided between the second substrate 1301 and the third substrate 1302. Terminals 1311 are provided for the FPC 1306.

Note that 1314 designates the drying material and have the effect to prevent entering the material such as an oxygen or water, which help deterioration, to OLED (not shown).

The second substrate 1301 and various films such as an insulating film provided between the second substrate 1301 and the extended wirings 1310 are partially removed by a laser beam or the like to provide contact holes 1313. Therefore, a plurality of the extended wirings 1310 are exposed through the contact holes 1313, and are respectively connected to the terminals 1311 through a conductive resin 1312 having anisotropy.

Although there is shown the example where the extended wirings are partially exposed from the side of the second substrate 1301 in FIGS. 8A to 8C, the present invention is not limited thereto. Alternatively, the extended wirings may be partially exposed from the side of the third substrate 1302.

Figure 9A:
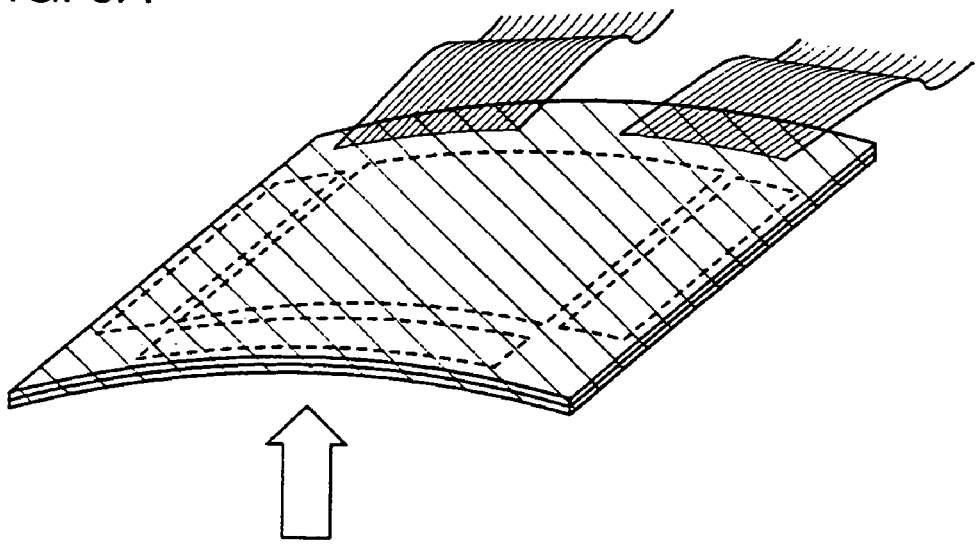
FIGS. 9A and 9B are a diagram showing a light-emitting device of the present invention when it is bent and a sectional view thereof.

FIG. 9A shows the light-emitting device shown in FIG. 8A in a bent state. Since the second substrate and the third substrate of the light emitting device described in Embodiment 3 both have flexibility, the light emitting device can be bent to a certain degree as shown in FIG. 9A. Thus, such a light-emitting device has a wide range of applications because it can be used for a display having a curved surface, a show window and the like. Moreover, not only the light-emitting device described in Embodiment 3 but also the light-emitting device described in Embodiment 4 can be similarly bent.

Figure 9B:
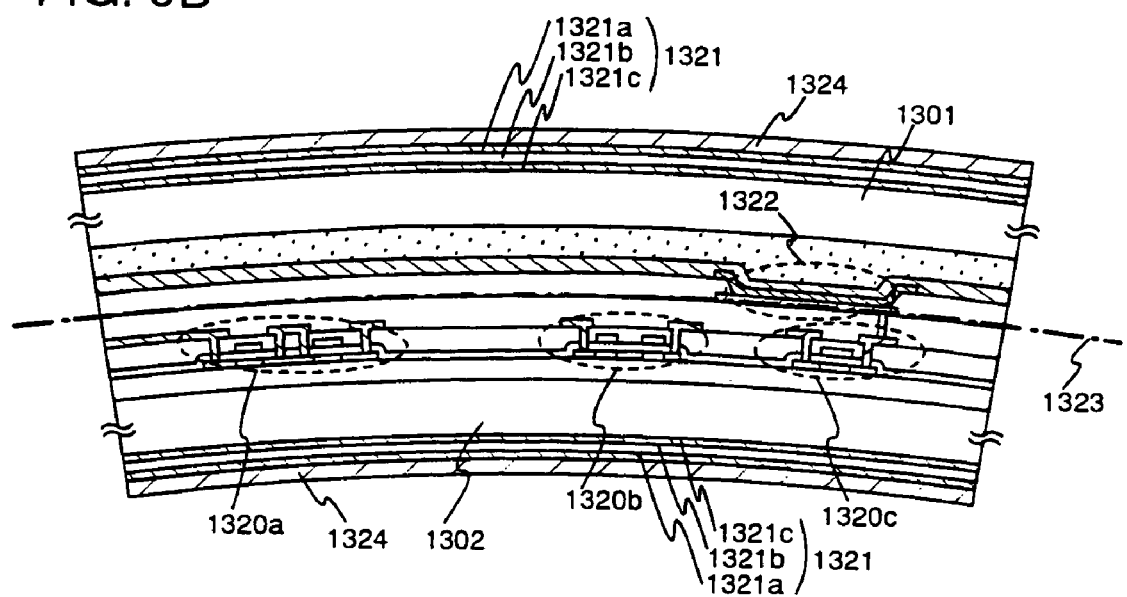

FIG. 9B is a cross-sectional view of the light-emitting device shown in FIG. 9A. A plurality of elements are formed between the second substrate 1301 and the third substrate 1302. Herein, TFTs 1320a, 1320b and 1320c and an OLED 1322 are representatively shown. A broken line 1323 represents a center line between the second substrate 1301 and the third substrate 1302.

The second substrate 1301 is covered with plastic film 1324 through the sealing film 1321. The third substrate 1302 is also covered with plastic film 1324 through the sealing film 1321.

The sealing film 1321 including a inorganic insulating film 1321a which contact to plastic film 1324, an organic insulating film 1321b which contact to inorganic insulating film 1321a and inorganic insulating film 1321c which contact to organic insulating film 1321b.

Figure 10:
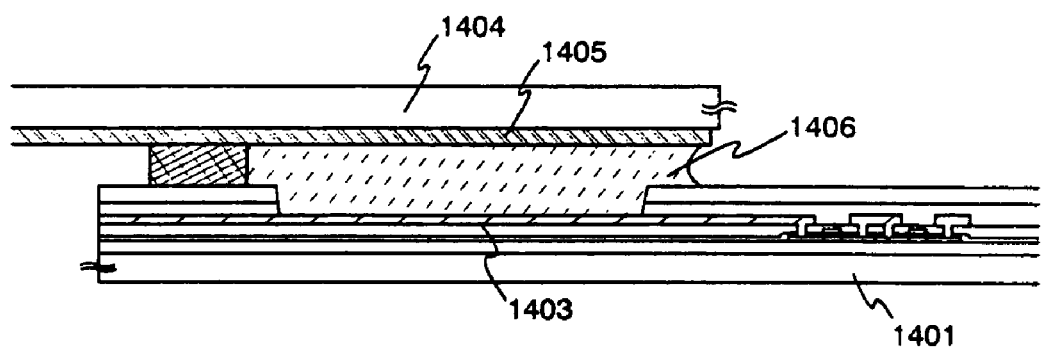
FIG. 10 is a sectional view of a light-emitting device of the present invention before sealing and shows its connection portion at which the device is connected to an FPC.

Next, the connection of the light-emitting device described in Embodiment 4 to the FPC will be described. FIG. 10 is a cross-sectional view showing a portion where the light-emitting device described in Embodiment 4 and the FPC are connected to each other.

A wiring 1403 for extension is provided on a third substrate 1401.

Various films such as an insulating film provided between the third substrate 1401 and the extended wring 1403 are partially removed by a laser beam or the like to provide a contact hole. Therefore, the extended wiring 1403 is exposed through the contact hole, and is electrically connected to a terminal 1405 included in an FPC 1404 through a conductive resin 1406 having anisotropy.

Although there is shown the example where the extended wiring 1403 is partially exposed by removing the part of insulating film provided on the extended wiring 1403 in FIG. 10, the present invention is not limited thereto. Alternatively, the extended wiring 1403 may be partially exposed from the side of the third substrate 1401.

Note that it is possible to implement Embodiment 5 in combination with Embodiments 1 to 2.

Embodiment 6

In Embodiment 6, an example of manufacturing method of the light-emitting device of the present invention is explained.

Figure 11A:
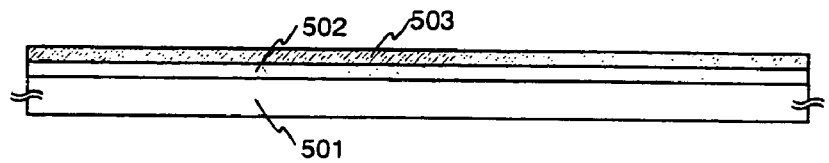
FIGS. 11A to 11D are diagrams showing a method of manufacturing a light-emitting device according to the present invention.

In FIG. 11A, a first bonding layer 502 made of an applied silicon oxide film (SOG) is formed to have a thickness of 100 to 500 nm (300 nm in this embodiment) is formed on a first substrate 501. Although a glass substrate is used as the first substrate 501 in this embodiment, a quartz substrate, a silicon substrate, a metal substrate or a ceramic substrate may be alternatively used. Any material can be used for the first substrate 501 as long as it is resistant to a treatment temperature in the later manufacturing steps.

As a method of forming the SOG film, an iodine solution is added to an SOG solution by spin coating, which is then dried to desorb iodine therefrom. Then, a thermal treatment at about 400° C. is conducted to form the SOG film. In this embodiment, the SOG film having a thickness of 100 nm is formed. A method of forming the SOG film as the first bonding layer 502 is not limited to the above method. Both an organic SOG and an inorganic SOG may be used as the SOG; any SOG can be used as long as it can be removed with hydrogen fluoride in the later step. It is important that the silicon oxide film, which is not desired to be removed, is formed to have a fine structure by sputtering or a CVD method so as to provide a high selection ratio when the first bonding layer is to be removed with hydrogen fluoride.

Next, a protection film made of Al is formed on the first bonding layer 502 by a low pressure thermal CVD method, a plasma CVD method, a sputtering method or an evaporation method. In this embodiment, a protection film 503 made of Al is formed to have a thickness of 200 nm on the first bonding layer 502 by sputtering.

Although Al is used as a material of the protection film 503 in this embodiment, the present invention is not limited thereto. It is important to select such a material that is not removed with removal of the first bonding layer 502 and that is not removed in the process other than in the step of removing the protection film 503. Furthermore, it is important that such a material does not allow removal of the other films and the substrates in the step of removing the protection film 503. The protection film 503 serves to protect an element formed on the first substrate 501 when the first bonding layer 502 is removed to peel off the first substrate 501.

Figure 11B:
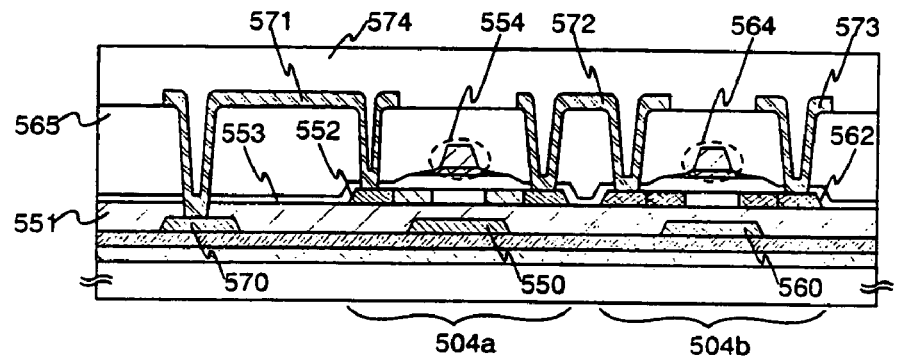

Next, an element is formed on the protection film 503 (FIG. 11B). In FIG. 11B, TFTs 504a and 504b in a driving circuit are shown as representative elements.

In this embodiment, the TFT 504a is an n-channel TFT whereas the TFT 504b is a p-channel TFT. The TFTs 504a and 504b form a CMOS.

The TFT 504a includes a first electrode 550 formed on the protection film 503, an insulating film 551 formed so as to cover the first electrode 550, a semiconductor film 552 formed so as to be in contact with the insulating film 551, an insulating film 553 formed so as to be in contact with the semiconductor film 552, and a second electrode 554 in contact with the insulating film 553.

The TFT 504b includes a first electrode 560, the insulating film 551 formed so as to cover the first electrode 560, a semiconductor film 562 formed so as to be in contact with the insulating film 551, the insulating film 553 formed so as to be in contact with the semiconductor film 562, and a second electrode 564 in contact with the insulating film 553.

A terminal 570, which is formed simultaneously with the first electrodes 550 and 560, is provided on the protection film 503.

Then, an insulating film 565 is formed so as to cover the TFTs 504a and 504b. A wiring 571 being in contact with the semiconductor film 552 and the terminal 570, a wiring 572 being in contact with the semiconductor films 552 and 562, and a wiring 573 being in contact with the semiconductor film 562 are formed via contact holes formed through the insulating films 565, 551 and 553.

Although not shown, an OLED is formed on the insulating film 565. An insulating film 574 is formed so as to cover the wirings 571, 572 and 573, the insulating film 565 and the OLED. It is preferred that the insulating film 574 has a flatter surface after its formation. The insulating film 574 is not necessarily formed.

Figure 11C:
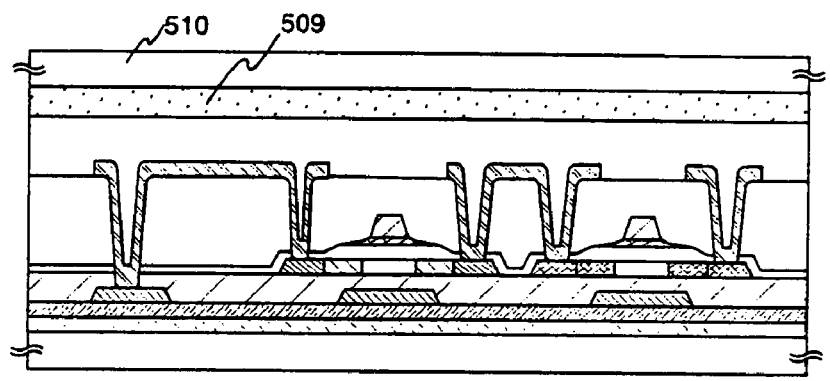

Next, as shown in FIG. 11C, a second substrate 510 is bonded to the first substrate through a second bonding layer 509. A plastic substrate is used as the second substrate 510 in this embodiment. More specifically a resin substrate having a thickness of 10 μm or more, for example, a substrate made of PES (polyether sulfone), PC (polycarbonate), PET (polyethylene terephthalate) or PEN (polyethylene naphthalate) can be used as the second substrate 510.

As a material of the second bonding layer 509, it is necessary to use a material which can provide a high selection ratio when the first bonding layer 502 is to be removed in the later step. Typically, an insulating film made of a resin can be used. Although polyimide is used in this embodiment, acryl, polyamide or an epoxy resin can also be used. In the case where the second bonding layer 509 is placed on the viewer side (the side of a light-emitting device user) when seen from the OLED, a material is required to have light transmittance.

Figure 11D:
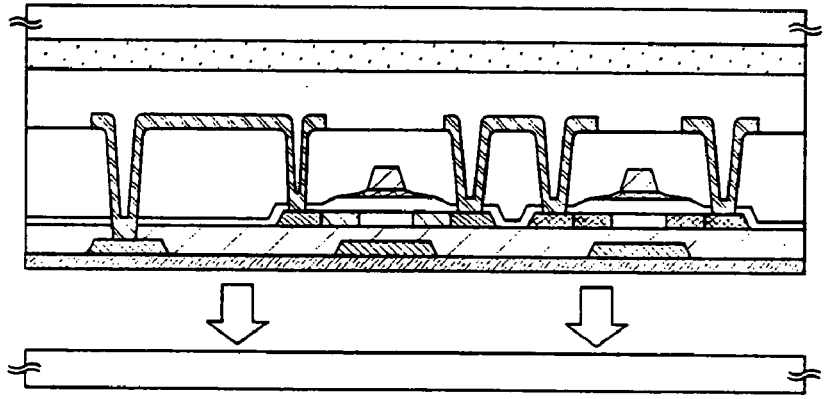

Next, as shown in FIG. 11D, the first bonding layer 502 is removed with hydrogen fluoride. In this embodiment, the first and second substrates 501 and 510, and all the elements and the entire films formed therebetween are dipped into buffered hydrofluoric acid ($HF/NH_4F$=0.01 to 0.2, for example, 0.1) so as to remove the first bonding layer 502.

Since the silicon oxide film, which is not desired to be removed, is made of a fine film formed by sputtering or a CVD method, only the first bonding layer is removed with hydrogen fluoride.

In the case of this embodiment, the first bonding layer 502 is gradually etched from its exposed edge portions. The first substrate 501 and the protection film 503 are separated from each other when the first bonding layer 502 is completely removed. After removal of the first bonding layer 502, the TFTs and the OLED, each of which includes a laminate of thin films, remain on the second substrate 510.

A large substrate is not preferred as the first substrate 501 because the time required for completely removing the first bonding layer 502 from its edges gets long with increase in size of the first substrate. Therefore, it is desirable that this embodiment is carried out for the first substrate 501 having a diagonal of 3 inches or less (preferably, 1 inch or less).

Figure 12A:
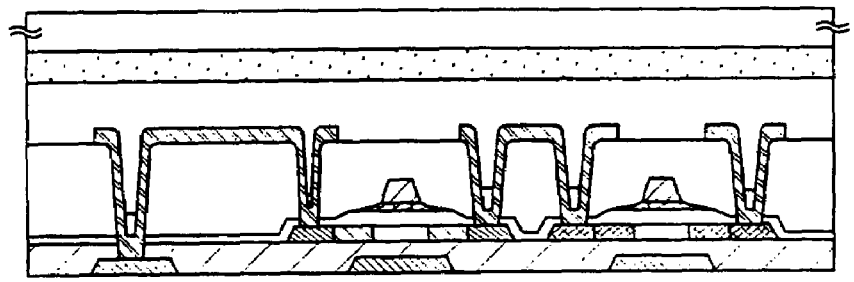
FIGS. 12A to 12C are diagrams showing a method of manufacturing a light-emitting device according to the present invention.

Next, as shown in FIG. 12A, the protection film 503 is removed. In this embodiment, the protection film 503 made of Al is removed by wet etching with a phosphoric acid type etchant so as to expose the terminal 570 and the first electrodes 550 and 560.

Figure 12B:
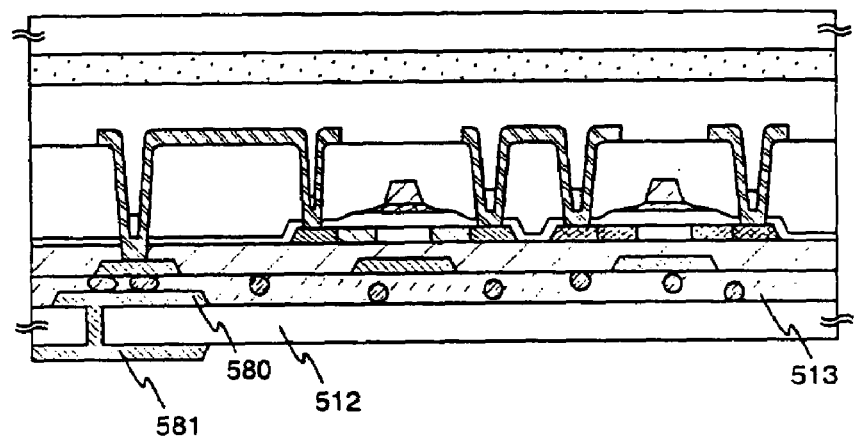

Then, as shown in FIG. 12B, a third bonding layer 513 made of a conductive resin having anisotropy is formed. Through the third bonding layer 513, the third substrate 512 is attached to the side where the terminal 570 and the first electrodes 550 and 560 are exposed.

In this embodiment, a plastic substrate is used as the third substrate 512. More specifically, a resin substrate having a thickness of 10 μm or more, for example, a substrate made of PES (polyether sulfone), PC (polycarbonate), PET (polyethylene terephthalate) or PEN (polyethylene naphthalate) can be used as the third substrate 512.

As the third bonding layer 513, an insulating film made of a resin (typically, polyimide, acryl, polyamide or an epoxy resin) can be used. In the case where the third bonding layer 513 is placed on the viewer side when seen from the OLED, a material is required to have light transmittance.

Then, a contact hole is formed through the third substrate 512 by a laser beam or the like. Al is evaporated on a portion of the third substrate 512 where the contact hole is formed and the periphery thereof, thereby forming terminals 580 and 581 on the respective surfaces of the third substrate 512, which are electrically connected to each other. A method of forming the terminals 580 and 581 is not limited to the above-mentioned structure.

The terminal 580 formed on the third substrate 512 is electrically connected through the third bonding layer 513 to the terminal 570 that is formed simultaneously with the first electrodes 550 and 560.

In this manner, a flexible light-emitting device interposed between the plastic substrates 510 and 512 can be obtained. With the use of the same material for the second substrate 510 and the third substrate 512, the substrates 510 and 512 have the same thermal expansion coefficient. As a result, the substrates 510 and 512 can be hardly affected by a stress strain due to change in temperature.

Figure 12C:
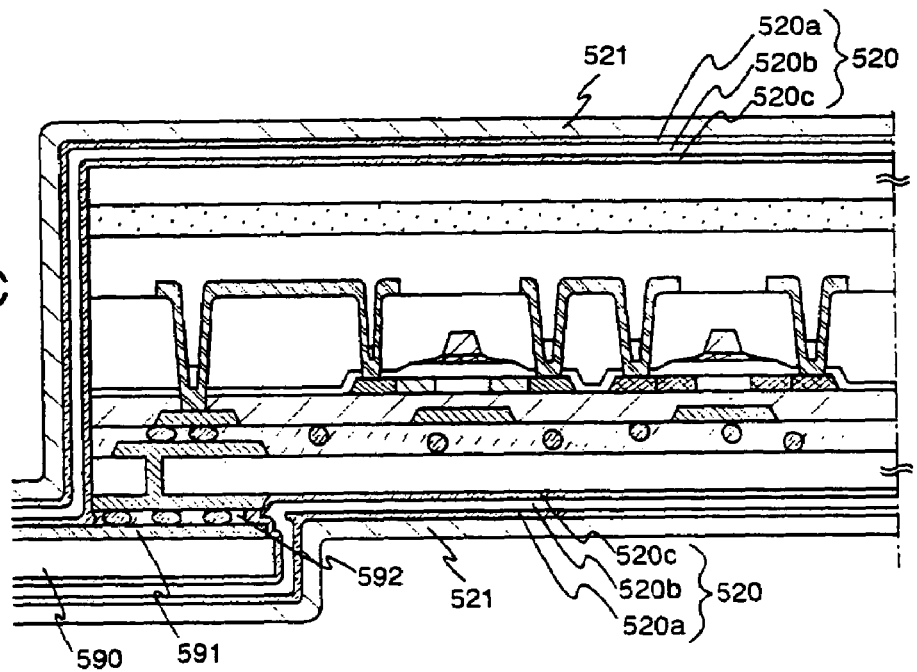

As shown in FIG. 12C, the terminal 581 formed so as not to be in contact with the third bonding layer 513 but to be in contact with the third substrate 512 and the terminal 591 included in an FPC 590 are connected to each other through a fourth bonding layer 592 made of an electrically conductive resin having an anisotropy.

Next, shown in FIG. 12C, the OLED panel is sealed by the a plastic film 521 in which he sealing film 520 is deposited. When the sealing is executed, the sealing film 520 is arranged between the plastic film 521 and the OLED (not shown in the figure).

In this embodiment, as a sealing film 520, an inorganic insulating film 520a, an organic insulating film 520b and inorganic insulating film 520c are formed from the side of the plastic film 521.

The light-emitting device manufactured according to this embodiment allows the manufacture of an element employing a semiconductor (for example, a TFT) without being limited by a heat resistance of the plastic substrate. Thus, the light-emitting device having extremely high performance can be obtained.

Although the first bonding layer 502 is made of SOG and is removed with hydrogen fluoride in this embodiment, the present invention is not limited to this structure. A material and a removal method of the first bonding layer 502 can be suitably determined by those who carry out the invention. It is important to determine a material and a removal method of the first bonding layer 502 so that the substrates, the element and the films other than the first bonding layer 502, which are not desired to be removed, are not removed with removal of the first bonding layer 502 and does not affect the operation of the light-emitting device. Moreover, it is also important that a material of the first bonding layer 502 does not allow its removal in the process other than the removal step of the first bonding layer 502.

For example, an organic material, which is entirely or partially vaporized by radiation of a laser beam, can be used as the first bonding layer 502. Additionally, it is desirable that a material having laser beam absorbance, for example, a colored or black material (for example, a resin material containing a black colorant) is used so that a laser beam is efficiently absorbed only by the first bonding layer 502 in the case where a second harmonic wave from a YAG laser is used. The first bonding layer 502, which is not vaporized in a heat treatment in the element formation steps, is used.

Each of the first, second and third bonding layers may be either single-layered or multi-layered. An amorphous silicon film or a DLC film may be provided between the bonding layer and the substrate.

The first bonding layer 502 may be formed of an amorphous silicon film, and in the later step, the first substrate may be peeled off by radiation of a laser beam onto the first bonding layer 502. In this case, in order to facilitate the peeling of the first substrate, it is preferred to use an amorphous silicon film containing a large amount of hydrogen. Hydrogen contained in the amorphous silicon film is vaporized by radiation of a laser beam, so that the first substrate can be easily peeled off.

As a laser beam, a pulse or a continuous wave excimer laser, a YAG laser or a $YVO_4$ laser can be used. A laser beam is radiated onto the first bonding layer through the first substrate so as to vaporize only the first bonding layer to peel off the first substrate. Therefore, as the first substrate, it is preferred to use a substrate having a thickness larger than that of the second and third substrates, which allows at least a radiated laser beam to pass through, typically a substrate having light transmittance, for example, a glass substrate, a quartz substrate or the like.

In the present invention, in order to allow a laser beam to pass through the first substrate, it is necessary to suitably select the type of a laser beam and the first substrate. For example, when a quartz substrate is used as the first substrate, a YAG laser (fundamental wave (1064 nm), a second harmonic wave (532 nm), a third harmonic wave (355 nm), and a fourth harmonic wave (266 nm)) or an excimer laser (wavelength: 308 nm) is used to form a linear beam which is in turn allowed to pass through the quartz substrate. It is noticed that an excimer laser beam does not pass through a glass substrate. Therefore, when a glass substrate is used as the first substrate, a fundamental wave, a second harmonic wave or a third harmonic wave of the YAG laser, preferably, a second harmonic wave (wavelength: 532 nm), is used to form a linear beam which is in turn allowed to pass through the glass substrate.

Alternatively, a method of separating the first substrate by spraying a fluid (a pressure-applied liquid or gas) on the first bonding layer (typically, a water jet method) or a combination with this method can be used.

In the case where the first bonding layer is made of an amorphous silicon film, the first bonding layer may be removed by using hydrazine.

Alternatively, a method of separating the first substrate by etching, described in a U.S. Pat. No. 5,821,138 may be used. Specifically, an applied silicon oxide film (SOG) may be used as the first bonding layer which is removed by hydrogen fluoride. In this case, it is important that the silicon oxide film, which is not desired to be removed, is formed to have a fine structure through a sputtering or a CVD method so that the silicon oxide film provides a high selection ratio when the first bonding layer is to be removed with hydrogen fluoride.

With such a structure, even if substrates having an extremely small thickness, specifically, 50 to 300 μm, preferably 150 to 200 μm are used as the second and third substrates, a light-emitting device with high reliability can be obtained. It was difficult to form an element on such a thin substrate by using a conventionally known manufacturing apparatus. However, since the element is formed with being bonded onto the first substrate, a manufacturing apparatus can be used with the use of a thick substrate without any alteration of the apparatus.

With the use of the sealing film including the multi-layered insulating film, it is possible to effectively restrain the degradation due to penetration of moisture or oxygen. Moreover, a crack is prevented from occurring upon bend of the substrate. As a result, a light-emitting device having enhanced flexibility can be realized.

This embodiment can be implemented by combining freely with Embodiment 1 or 2.

Embodiment 7

In this embodiment, a method of forming TFT of a driving circuit (a source signal line driver circuit and a gate signal line driver circuit) arranged in the periphery of the pixel portion and a pixel portion will be explained in detail. In this embodiment, in relation to the driver circuit, CMOS circuit is only shown as a basic unit for brief description.

Figure 13A:
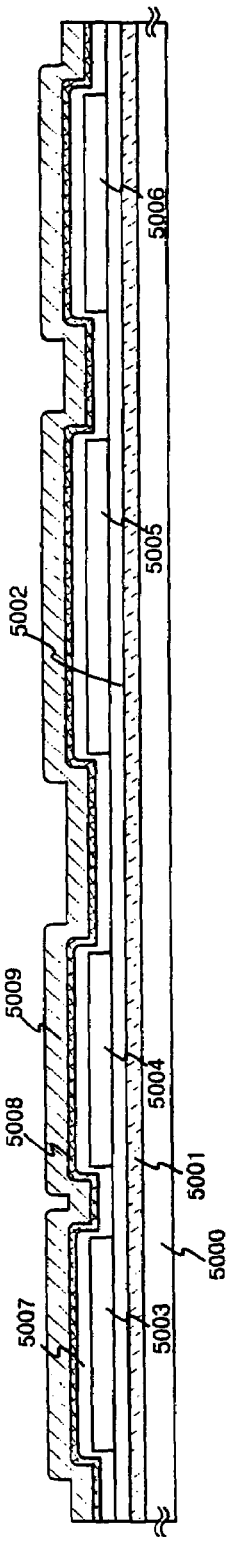
FIGS. 13A to 13C are diagrams showing a method of manufacturing TFTs and OLEDs of a light-emitting device according to the present invention.

First, as shown in FIG. 13A, a first bonding film 5001 formed of amorphous silicon film is formed and having a thickness of from 100 to 500 nm (preferably 300 nm) on a first substrate 5000 formed of glass such as barium borosilicate glass or alumino borosilicate glass represented by #7059 glass and #1737 glass of CORNING Corporation, etc. The first bonding film 5001 is formed by using a low pressure thermal CVD method, plasma CVD method, sputtering method or evaporation method can be used. The first bonding film 5001 is formed by using sputtering method in this embodiment.

Next, a base film 5002 formed of an insulating film such as a silicon oxide film, a silicon oxynitride film or a silicon nitride oxide film is formed on the first bonding film 5001. The base film 5002 has an effect of protecting an element formed on a substrate 5000 when the first bonding layer 5001 is removed to peel off the substrate 5000. For example, a silicon nitride oxide film formed from $SiH_4$, $NH_3$ and $N_2O$ by the plasma CVD method and having a thickness of from 10 to 200 nm (preferably 50 to 100 nm) is formed. Similarly, a hydrogenated silicon nitride oxide film formed from $SiH_4$ and $N_2O$ and having a thickness of from 50 to 200 nm (preferably 100 to 150 nm) is layered thereon. In this embodiment, the base film 5002 has a two-layer structure, but may also be formed as a single layer film of one of the above insulating films, or a laminate film having more than two layers of the above insulating films.

Island-like semiconductor layers 5003 to 5006 are formed from a crystalline semiconductor film obtained by conducting laser crystallization or a known thermal crystallization on a semiconductor film having an amorphous structure. These island-like semiconductor layers 5003 to 5006 each has a thickness of from 25 to 80 nm (preferably 30 to 60 nm). No limitation is put on the material of the crystalline semiconductor film, but the crystalline semiconductor film is preferably formed from silicon, a silicon germanium (SiGe) alloy, etc.

When the crystalline semiconductor film is to be manufactured by the laser crystallization method, an excimer laser, a YAG laser and an $YVO_4$ laser of a pulse oscillation type or continuous light emitting type are used. When these lasers are used, it is preferable to use a method in which a laser beam radiated from a laser emitting device is converged into a linear shape by an optical system and then is irradiated to the semiconductor film. A crystallization condition is suitably selected by an operator. When the excimer laser is used, pulse oscillation frequency is set to 300 Hz, and laser energy density is set to from 100 to 400 $mJ/cm^2$ (typically 200 to 300 $mJ/cm^2$. When the YAG laser is used, pulse oscillation frequency is preferably set to from 30 to 300 kHz by using its second harmonic, and laser energy density is preferably set to from 300 to 600 $mJ/cm^2$ (typically 350 to 500 $mJ/cm^2$). The laser beam converged into a linear shape and having a width of from 100 to 1000 μm, e.g. 400 μm is, is irradiated to the entire substrate face. At this time, overlapping ratio of the linear laser beam is set to from 50 to 90%.

Next, a gate insulating film 5007 covering the island-like semiconductor layers 5003 to 5006 is formed. The gate insulating film 5007 is formed from an insulating film containing silicon and having a thickness of from 40 to 150 nm by using the plasma CVD method or a sputtering method. In this embodiment, the gate insulating film 5007 is formed from a silicon nitride oxide film of 120 nm in thickness. However, the gate insulating film is not limited to such a silicon nitride oxide film, but it may be an insulating film containing other and having a single layer or a laminated layer structure. For example, when a silicon oxide film is used, TEOS (Tetraethyl Orthosilicate) and $O_2$ are mixed by the plasma CVD method, the reaction pressure is set to 40 Pa, the substrate temperature is set to from 300 to 400° C., and the high frequency (13.56 MHz) power density is set to from 0.5 to 0.8 W/cm$^2$ for electric discharge. Thus, the silicon oxide film can be formed by discharge. The silicon oxide film manufactured in this way can then obtain preferable characteristics as the gate insulating film by thermal annealing at from 400 to 500° C.

A first conductive film 5008 and a second conductive film 5009 for forming a gate electrode are formed on the gate insulating film 5007. In this embodiment, the first conductive film 5008 having a thickness of from 50 to 100 nm is formed from Ta, and the second conductive film 5009 having a thickness of from 100 to 300 nm is formed from W.

The Ta film is formed by a sputtering method, and the target of Ta is sputtered by Ar. In this case, when suitable amounts of Xe and Kr are added to Ar, internal stress of the Ta film is released, and pealing off this film can be prevented. Resistivity of the Ta film of α phase is about 20 μΩcm, and this Ta film can be used for the gate electrode. However, resistivity of the Ta film of β phase is about 180 μΩcm, and is not suitable for the gate electrode. When tantalum nitride having a crystal structure close to that of the α phase of Ta and having a thickness of about 10 to 50 nm is formed in advance as the base for the Ta film to form the Ta film of the α phase, the Ta film of α phase can be easily obtained.

The W film is formed by the sputtering method with W as a target. Further, the W film can be also formed by a thermal CVD method using tungsten hexafluoride (WF$_6$). In any case, it is necessary to reduce resistance to use this film as the gate electrode. It is desirable to set resistivity of the W film to be equal to or smaller than 20 μΩcm. When crystal grains of the W film are increased in size, resistivity of the W film can be reduced. However, when there are many impurity elements such as oxygen, etc. within the W film, crystallization is prevented and resistivity is increased. Accordingly, in the case of the sputtering method, a W-target of 99.9999% or 99.99% in purity is used, and the W film is formed by taking a sufficient care of not mixing impurities from a gaseous phase into the W film time when the film is to be formed. Thus, a resistivity of from 9 to 20 μΩcm can be realized.

In this embodiment, the first conductive film 5008 is formed from Ta, and the second conductive film 5009 is formed from W. However, the present invention is not limited to this case. Each of these conductive films may also be formed from an element selected from Ta, W, Ti, Mo, Al and Cu, or an alloy material or a compound material having these elements as principal components.

Further, a semiconductor film represented by a poly crystal silicon film doped with an impurity element such as phosphorus may also be used. Examples of combinations other than those shown in this embodiment include: a combination in which the first conductive film 5008 is formed from tantalum nitride (TaN), and the second conductive film 5009 is formed from W; a combination in which the first conductive film 5008 is formed from tantalum nitride (TaN), and the second conductive film 5009 is formed from Al; and a combination in which the first conductive film 5008 is formed from tantalum nitride (TaN), and the second conductive film 5009 is formed from Cu.

Next, a mask 5010 is formed from a resist, and first etching processing for forming an electrode and wiring is performed. In this embodiment, an ICP (Inductively Coupled Plasma) etching method is used, and CF$_4$ and Cl$_2$ are mixed with a gas for etching. RF (13.56 MHz) power of 500 W is applied to the electrode of coil type at a pressure of 1 Pa so that plasma is generated. RF (13.56 MHz) of 100 W power is also applied to a substrate side (sample stage), and a substantially negative self bias voltage is applied. When CF$_4$ and Cl$_2$ are mixed, the W film and the Ta film are etched to the same extent.

Under the above etching condition, end portions of a first conductive layer and a second conductive layer are formed into a tapered shape by effects of the bias voltage applied to the substrate side by making the shape of the mask formed from the resist into an appropriate shape. The angle of a taper portion is set to from 15° to 45°. It is preferable to increase an etching time by a ratio of about 10 to 20% so as to perform the etching without leaving the residue on the gate insulating film. Since a selection ratio of a silicon nitride oxide film to the W film ranges from 2 to 4 (typically 3), an exposed face of the silicon nitride oxide film is etched by about 20 to 50 nm by over-etching processing. Thus, conductive layers 5011 to 5016 of a first shape (first conductive layers 5011a to 5016a and second conductive layers 5011b to 5016b) formed of the first and second conductive layers are formed by the first etching processing. A region that is not covered with the conductive layers 5011 to 5016 of the first shape is etched by about 20 to 50 nm in the gate insulating film 5007, so that a thinned region is formed. (See FIG. 13A).

Figure 13B:
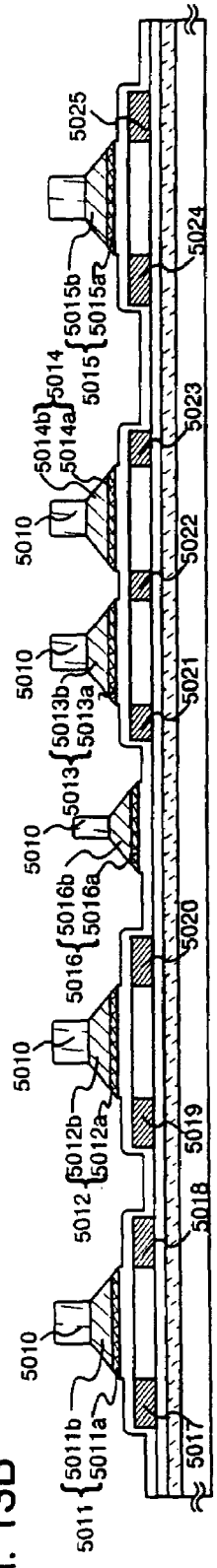

Then, an impurity element for giving an n-type conductivity is added by performing first doping processing. A doping method may be either an ion doping method or an ion implantation method. The ion doping method is carried out under the condition that a dose is set to from $1\times10^{13}$ to $5\times10^{14}$ atoms/cm$^2$, and an acceleration voltage is set to from 60 to 100 keV. An element belonging to group 15, typically, phosphorus (P) or arsenic (As) is used as the impurity element for giving the n-type conductivity. However, phosphorus (P) is used here. In this case, the conductive layers 5011 to 5015 serve as masks with respect to the impurity element for giving the n-type conductivity, and first impurity regions 5017 to 5025 are formed in a self-aligning manner. The impurity element for giving the n-type conductivity is added to the first impurity regions 5017 to 5025 in a concentration range from $1\times10^{20}$ to $1\times10^{21}$ atoms/cm$^3$. (See FIG. 13B).

Figure 13C:
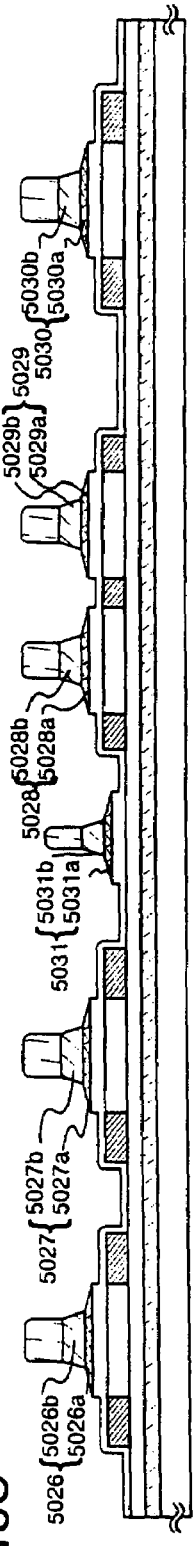

Second etching processing is next performed without removing the resist mask as shown in FIG. 13C. A W film is etched selectively by using CF$_4$, Cl$_2$ and O2. The conductive layers 5026 to 5031 of a second shape (first conductive layers 5026a to 5031a and second conductive layers 5026b to 5031b) are formed by the second etching processing. A region of the gate insulating film 5007, which is not covered with the conductive layers 5026 to 5031 of the second shape, is further etched by about 20 to 50 nm so that a thinned region is formed.

An etching reaction in the etching of the W film using the mixed gas of CF$_4$ and Cl$_2$ and the Ta film can be assumed from the vapor pressure of a radical or ion species generated and a reaction product. When the vapor pressures of a fluoride and a chloride of W and Ta are compared, the vapor pressure of WF$_6$ as a fluoride of W is extremely high, and vapor pressures of other WCl$_5$, TaF$_5$ and TaCl$_5$ are approximately equal to each other. Accordingly, both the W film and the Ta film are etched using the mixed gas of CF$_4$ and Cl$_2$. However, when a suitable amount of O$_2$ is added to this mixed gas. CF$_4$ and $_2$ react and become CO and F so that a large amount of F-radicals or F-ions is generated. As a result, the etching speed of the W film whose fluoride has a high vapor pressure is increased. In contrast to this, the increase in etching speed is relatively small for the Ta film when F is increased. Since Ta is easily oxidized in comparison with W, the surface of the Ta film is oxidized by adding $O_2$. Since no oxide of Ta reacts with fluorine or chloride, the etching speed of the Ta film is further reduced. Accordingly, it is possible to make a difference in etching speed between the W film and the Ta film so that the etching speed of the W film can be set to be higher than that of the Ta film.

Figure 14A:
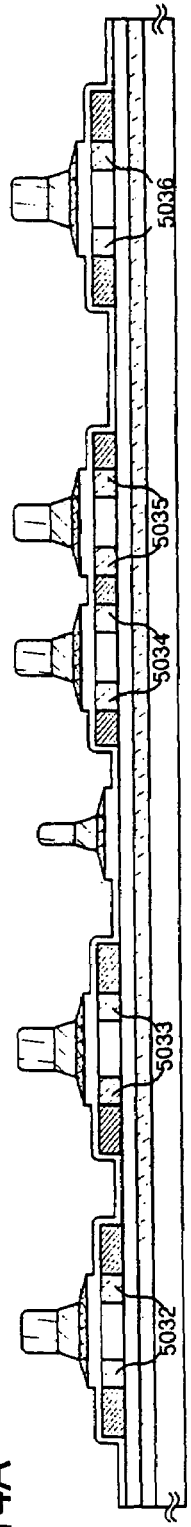
FIGS. 14A to 14C are diagrams showing a method of manufacturing TFTs and OLEDs of a light-emitting device according to the present invention.

As shown in FIG. 14A, second doping processing is then performed. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 keV, and the dose is set to $1 \times 10^{13}$ atoms/cm$^2$. Thus, a new impurity region is formed inside the first impurity region formed in the island-like semiconductor layer in FIG. 13B. In the doping, the conductive layers 5026 to 5030 of the second shape are used as masks with respect to the impurity element, and the doping is performed such that the impurity element is also added to regions underside the first conductive layers 5026a to 5030a. Thus, third impurity regions 5032 to 5041 are formed. The third impurity regions 5032 to 5036 contain phosphorus (P) with a gentle concentration gradient that conforms with the thickness gradient in the tapered portions of the first conductive layers 5026a to 5030a. In the semiconductor layers that overlap the tapered portions of the first conductive layers 5026a to 5030a, the impurity concentration is slightly lower around the center than at the edges of the tapered portions of the first conductive layers 5026a to 5030a. However, the difference is very slight and almost the same impurity concentration is kept throughout the semiconductor layers.

Figure 14B:
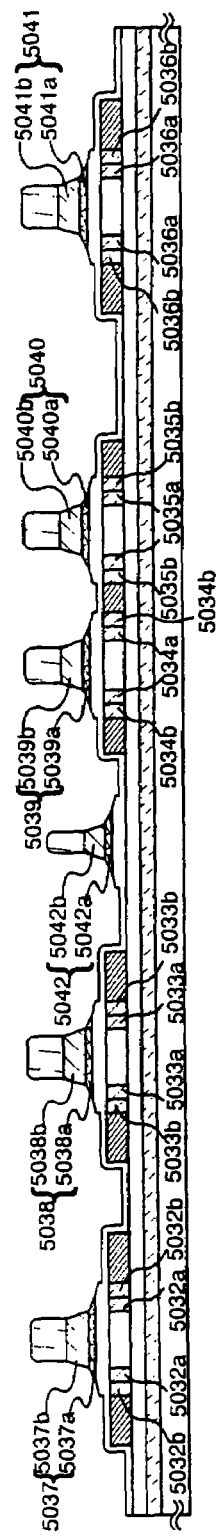

Third etching treatment is then carried out as shown in FIG. 14B. CHF, is used as etching gas, and reactive ion etching (RIE) is employed. Through the third etching treatment, the tapered portions of the first conductive layers 5026a to 5031a are partially etched to reduce the regions where the first conductive layers overlap the semiconductor layers. Thus formed are third shape conductive layers 5037 to 5042 (first conductive layers 4037a to 5042a and second conductive layers 5037b to 5042b). At this point, regions of the gate insulating film 5007 that are not covered with the third shape conductive layers 5037 to 5042 are further etched and thinned by about 20 to 50 nm.

Third impurity regions 5032 to 5036 are formed through the third etching treatment. The third impurity regions 5032a to 5036a that overlap the first conductive layers 4037a to 5041a, respectively, and second impurity regions 5032b to 5036b each formed between a first impurity region and a third impurity region.

Figure 14C:
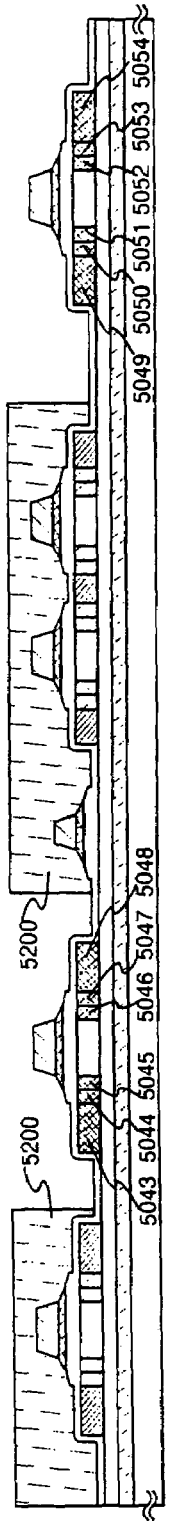

As shown in FIG. 14C, fourth impurity regions 5043 to 5054 having the opposite conductivity type to the first conductivity type are formed in the island-like semiconductor layers 5004 and 5006 for forming p-channel TFTs. The third shape conductive layers 4038b and 5041b are used as masks against the impurity element and impurity regions are formed in a self-aligning manner. At this point, the island-like semiconductor layers 5003 and 5005 for forming n-channel TFTs and the wiring portion 5042 are entirely covered with a resist mask 5200. The impurity regions 5043 to 5054 have already been doped with phosphorus in different concentrations. The impurity regions 5043 to 5054 are doped with diborane ($B_2H_6$) through ion doping such that diborane dominates phosphorus in each region and each region contain the impurity element in a concentration of $2 \times 10^{20}$ to $2 \times 10^{21}$ atoms/cm$^3$.

Through the steps above, the impurity regions are formed in the respective island-like semiconductor layers. The third shape conductive layers 5037 to 5041 overlapping the island-like semiconductor layers function as gate electrodes. Reference numeral 5042 function as island-like source signal line.

After resist mask 5200 is removed, a step of activating the impurity elements added to the island-like semiconductor layers is performed to control the conductivity type. This process is performed by a thermal annealing method using a furnace for furnace annealing. Further, a laser annealing method or a rapid thermal annealing method (RTA method) can be applied. In the thermal annealing method, this process is performed at a temperature of from 400 to 700° C., typically from 500 to 600° C. within a nitrogen atmosphere in which oxygen concentration is equal to or smaller than 1 ppm and is preferably equal to or smaller than 0.1 ppm. In this embodiment, heat treatment is performed for four hours at a temperature of 500° C. When a wiring material used in the third shape conductive layers 5037 to 5042 is weak against heat, it is preferable to perform activation after an interlayer insulating film (having silicon as a principal component) is formed in order to protect wiring, etc.

Further, the heat treatment is performed for 1 to 12 hours at a temperature of from 300 to 450° C. within an atmosphere including 3 to 100% of hydrogen so that the island-like semiconductor layer is hydrogenated. This step is to terminate a dangling bond of the semiconductor layer by hydrogen thermally excited. Plasma hydrogenation (using hydrogen excited by plasma) may also be performed as another measure for hydrogenation.

Figure 15A:
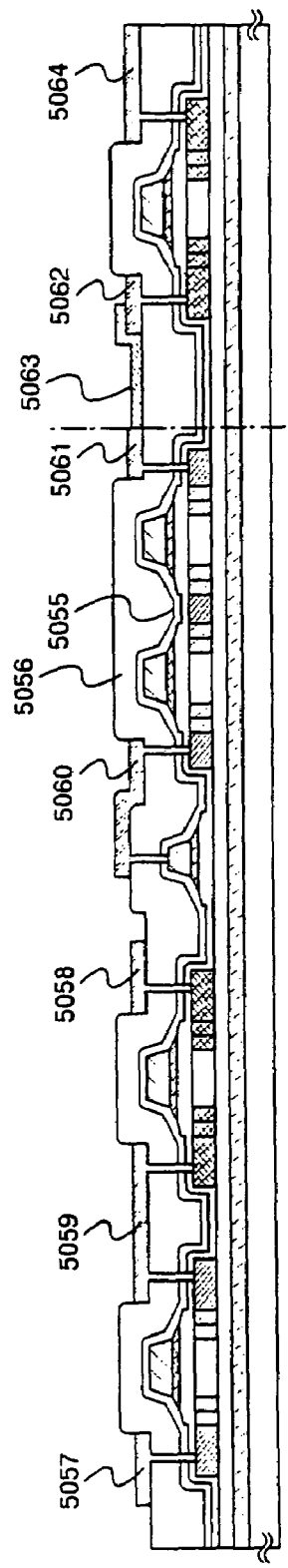
FIGS. 15A and 15B are diagrams showing a method of manufacturing TFTs and OLEDs of a light-emitting device according to the present invention.

Next, as shown in FIG. 15A, a first interlayer insulating film 5055 is formed from a nitride oxide silicon film to 100 to 200 nm thick. The second interlayer insulating film 5056 from an organic insulating material is formed on the first interlayer insulating film. Thereafter, contact holes are formed through the first interlayer insulating film 5055, the second interlayer insulating film 5056 and the gate insulating film 5007. Each wiring (including a connecting wiring and a signal line) 5057 to 5062, and 5064 are patterned and formed. Thereafter, a pixel electrode 5063 coming in contact with the connecting wiring 5062 is patterned and formed.

A film having an organic resin as a material is used as the second interlayer insulating film 5056. Polyimide, polyamide, acrylic, BCB (benzocyclobutene), etc. can be used as this organic resin. In particular, since the second interlayer insulating film 5056 is provided mainly for planarization, acrylic excellent in leveling the film is preferable. In this embodiment, an acrylic film having a thickness that can sufficiently level a level difference caused by the TFT is formed. The film thickness thereof is preferably set to from 1 to 5 μm (is further preferably set to from 2 to 4 μm).

In the formation of the contact holes, contact holes reaching n-type impurity regions 5017, 5018, 5021 and 5023 or p-type impurity regions 5043 to 5054, a contact hole reaching wiring 5042, an contact hole reaching an electric current supply line (not illustrated), and contact holes reaching gate electrodes (not illustrated) are formed.

Further, a laminate film of a three-layer structure is patterned in a desired shape and is used as wiring (including a connecting wiring and signal line) 5057 to 5062 and 5064. In this three-layer structure, a Ti film of 100 [nm] in thickness, an aluminum film containing Ti of 300 [nm] in thickness, and a Ti film of 150 [nm] in thickness are continuously formed by the sputtering method. However, another conductive film may also be used.

In this embodiment, an ITO film of 110 nm in thickness is formed as a pixel electrode 5063, and is patterned. Contact is made by arranging the pixel electrode 5063 such that this pixel electrode 5063 comes in contact with the connecting electrode 5062 and is overlapped with this connecting wiring 5062. Further, a transparent conductive film provided by mixing 2 to 20% of zinc oxide (ZnO) with indium oxide may also be used. This pixel electrode 5063 becomes an anode of the OLED. (See FIG. 15A)

Figure 15B:
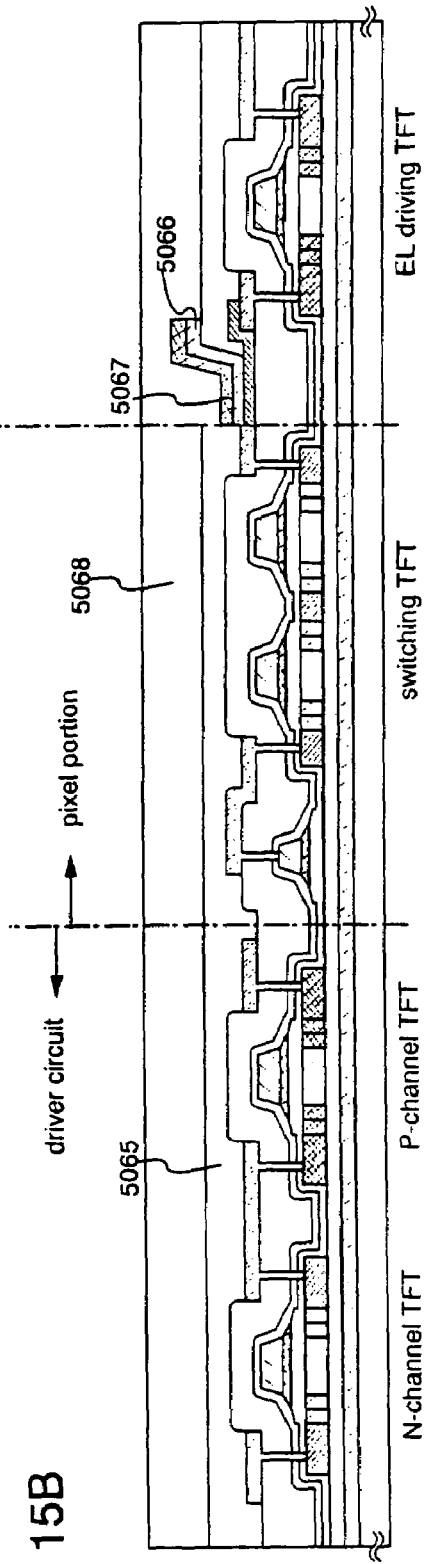

As shown in FIG. 15B, an insulating film (a silicon oxide film in this embodiment) containing silicon and having a thickness of 500 nm is next formed. A third interlayer insulating film 5065 is formed in which an opening is formed in a position corresponding to the pixel electrode 5063. When the opening is formed, a side wall of the opening can easily be tapered by using the wet etching method. When the side wall of the opening is not gentle enough, deterioration of an organic light emitting layer caused by a level difference becomes a notable problem.

Next, an organic light emitting layer 5066 and a cathode (MgAg electrode) 5067 are continuously formed by using the vacuum evaporation method without exposing to the atmosphere. The organic light emitting layer 5066 has a thickness of from 80 to 200 nm (typically from 100 to 120 nm), and the cathode 5067 has a thickness of from 180 to 300 nm (typically from 200 to 250 nm).

In this process, the organic light emitting layer is sequentially formed with respect to a pixel corresponding to red, a pixel corresponding to green and a pixel corresponding to blue. In this case, since the organic light emitting layer has an insufficient resistance against a solution, the organic light emitting layer must be formed separately for each color instead of using a photolithography technique. Therefore, it is preferable to cover a portion except for desired pixels using a metal mask so that the organic light emitting layer is formed selectively only in a required portion.

Namely, a mask for covering all portions except for the pixel corresponding to red is first set, and the organic light emitting layer for emitting red light are selectively formed by using this mask. Next, a mask for covering all portions except for the pixel corresponding to green is set, and the organic light emitting layer for emitting green light are selectively formed by using this mask. Next, a mask for covering all portions except for the pixel corresponding to blue is similarly set, and the organic light emitting layer for emitting blue light are selectively formed by using this mask. Here, different masks are used, but instead the same single mask may be used repeatedly.

Here, a system for forming three kinds of OLED corresponding to RGB is used. However, a system in which an OLED for emitting white light and a color filter are combined, a system in which the OLED for emitting blue or blue green light is combined with a fluorescent substance (a fluorescent color converting medium: CCM), a system for overlapping the OLED respectively corresponding to R, G, and B with the cathodes (opposite electrodes) by utilizing a transparent electrode, etc. may be used.

A known material can be used as the organic light emitting layer 5066. An organic material is preferably used as the known material in consideration of a driving voltage. For example, a four-layer structure consisting of a hole injection layer, a hole transportation layer, a light emitting layer and an electron injection layer is preferably used for the organic light emitting layer.

The cathode 5067 is formed next on the pixel (pixel on the same line) included the switching TFT in which the gate electrode is connected to the same gate signal line by using a metal mask. This embodiment uses MgAg for the cathode 5067 but it is not limited thereto. Other known materials may be used for the cathode 5067.

Finally, a planarization film 5068 formed of resin and having a thickness of 300 nm is formed. In reality, the planarization film 5068 plays a role of protecting the organic light emitting layer 5066 from moisture, etc. However, reliability of OLED can be further improved by forming the planarization film 5068.

Thus, the state as shown in FIG. 15B is completed. Though not shown in figures, according to manufacturing method in Embodiment 3, the second substrate providing sealing film is bonded to the planarization film 5068 by using a second bonding layer. In addition, following steps can be executed in according to methods shown in Embodiment Mode 1. In accordance of manufacturing method in Embodiment 4, the second substrate providing sealing film is bonded to the planarization film 5068 by using a second bonding layer. In addition, following steps can be executed in according to methods shown in Embodiment Mode 2.

In the process of forming the light-emitting device in this embodiment, the source signal line is formed from Ta and W that are materials of the gate electrodes, and the gate signal line is formed from Al that is a wiring material of the source and drain electrodes for conveniences of the circuit construction and procedures in the process. However, different materials may also be used.

The light-emitting device in this embodiment has very high reliability and improved operating characteristics by arranging the TFTs of the optimal structures in a driving circuit portion in addition to the pixel portion. Further, in a crystallization process, crystallinity can be also improved by adding a metal catalyst such as Ni. Thus, a driving frequency of the source signal line driving circuit can be set to 10 MHz or more.

First, the TFT having a structure for reducing hot carrier injection so as not to reduce an operating speed as much as possible is used as an n-channel type TFT of a CMOS circuit forming the driving circuit portion. Here, the driving circuit includes a shift register, a buffer, a level shifter, a latch in line sequential driving, a transmission gate in dot sequential driving, etc.

In the case of this embodiment, an active layer of the n-channel type TFT includes a source region, a drain region, an overlap LDD region (Lov region) that is overlapped with the gate electrode through the gate insulating film, an offset LDD region (Loff region) that is not overlapped with the gate electrode through the gate insulating film, and channel formation region.

Deterioration by the hot carrier injection in the p-channel type TFT of the CMOS circuit is almost negligible. Therefore, it is not necessary to particularly form the LDD region in this n-channel type TFT. However, similar to the n-channel type TFT, the LDD region can be formed as a hot carrier countermeasure.

Further, when the CMOS circuit for bi-directionally flowing an electric current through a channel forming region, i.e., the CMOS circuit in which roles of the source and drain regions are exchanged is used in the driving circuit, it is preferable for the n-channel type TFT that constitutes the CMOS circuit to form LDD regions such that the channel forming region is sandwiched between the LDD regions. As an example of this, a transmission gate used in the dot sequential driving is given. When a CMOS circuit required to reduce an OFF-state current value as much as possible is used in the driving circuit, the n-channel type TFT forming the CMOS circuit preferably has a Lov region. The transmission gate used in the dot sequential driving can be given also as an example as such.

Furthermore, in accordance with the processes shown in this embodiment, the number of photomasks can be reduced that is need for manufacturing the light-emitting device. As a result, the processes can be reduced, and this contributes to a reduction in the manufacturing costs and an increase in throughput.

Note that it is possible to implement Embodiment 7 in combination with Embodiments 1 to 5.

Embodiment 8

In Embodiment 8 a structure of a light-emitting device using inverse-stagger type TFTs according to the present invention will be described.

Figure 16:
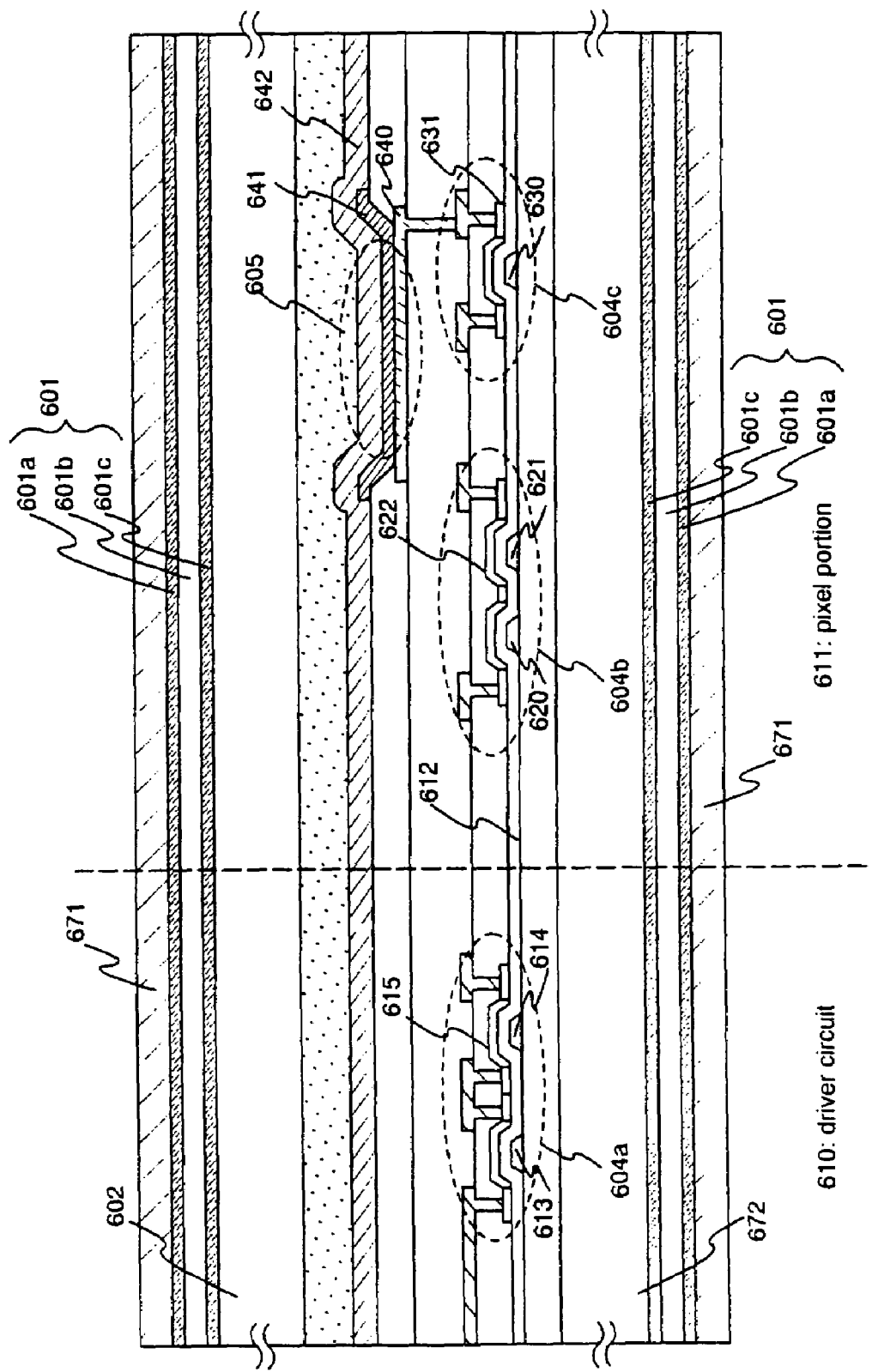
FIG. 16 is a sectional view of a light-emitting device of the present invention.

FIG. 16 is a cross-sectional view showing a light-emitting device according to the present invention. A sealing film 601 is formed on a flexible second substrate 602 and a third substrate 672. The sealing film 601 includes an inorganic insulating film 601a, a organic insulating film 601b and an inorganic insulating film 601c.

Between the flexible second substrate 602 and the third substrate 672. TFTs, an OLED and other elements are formed. In this embodiment, a TFT 604a included in a driving circuit 610 and TFTs 604b and 604c included in a pixel portion 611 are shown as representative examples.

An OLED 605 includes a pixel electrode 640, an organic light emitting layer 641 and a cathode 642.

The TFT 604a includes gate electrodes 613 and 614, an insulating film 612 formed so as to be in contact with the gate electrodes 613 and 614, and a semiconductor film 615 formed so as to be in contact with the insulating film 612. The TFT 604b includes gate electrodes 620 and 621, the insulating film 612 formed so as to be in contact with the gate electrodes 620 and 621, and a semiconductor film 622 formed so as to be in contact with the insulating film 612. The TFT 604c includes a gate electrode 630 the insulating film 612 formed so as to be in contact with the gate electrode 630, and a semiconductor film 631 formed so as to be in contact with the insulating film 612.

Although there is shown the example where the inverse-stagger type TFTs are used in the light-emitting device manufactured according to Embodiment 3, the structure of this embodiment is not limited thereto. The inverse-stagger type TFTs may be used in the light-emitting device manufactured according to Embodiment 4.

Embodiment 8 can be carried out in free combination with Embodiments 1 to 5.

Embodiment 9

In Embodiment 9, an example where a bonding layer is removed by spraying a fluid thereon will be described.

As a method of spraying a fluid, a method of spraying a high-pressure water flow from a nozzle on an object (referred to as a water jet method) or a method of spraying a high-pressure gas flow on an object can be used. In the case of the water jet method, an organic solvent, an acid solution or an alkaline solution may be used instead of water. As a gas flow, air, a nitrogen gas, a carbon dioxide gas or a rare gas may be used. Furthermore, a plasma obtained from these gases may also be used. It is important to select an appropriate fluid in accordance with a material of the bonding layer and materials of the films and substrates which are not desired to be removed so that such films and substrates are not removed with removal of the bonding layer.

As a bonding layer, a porous silicon layer or a silicon layer to which hydrogen, oxygen, nitrogen or a rare gas is added is used. In the case where a porous silicon layer is used, an amorphous silicon film or a polycrystalline silicon film may be subjected to anodization to provide porousness thereto for use.

Figure 17:
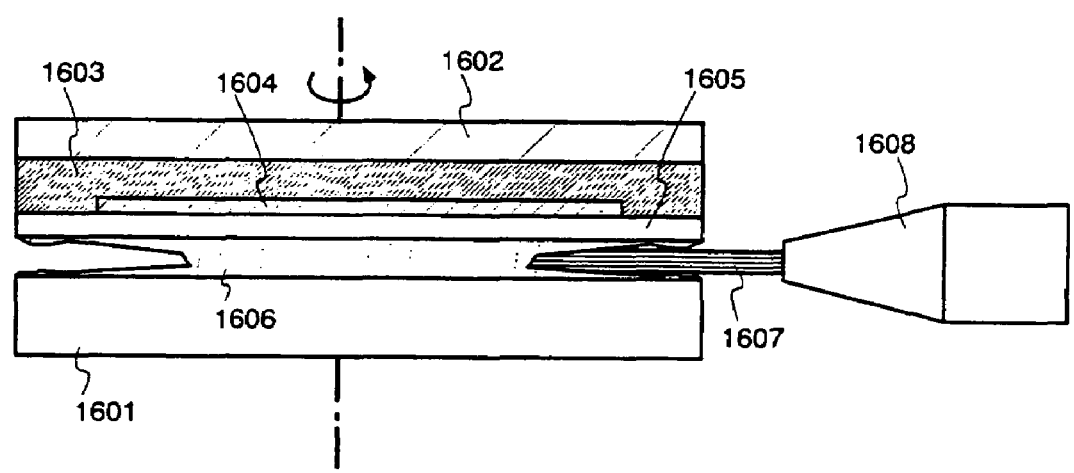
FIG. 17 is a diagram illustrating how an adhesive layer is removed by a water jet method.

FIG. 17 shows removal of a bonding layer by a water jet method. An OLED 1604 is provided between substrates 1601 and 1602. The OLED 1604 is covered with an insulating film 1603.

An insulating film 1605 and a bonding layer 1606 are provided between the substrate 1601 and the OLED 1604. The bonding layer 1606 is in contact with the substrate 1601. Although only the OLED is representatively shown in FIG. 17. TFTs and other elements are normally provided between the insulating films 1605 and 1603.

The bonding layer 1606 may have a thickness of 0.1 to 900 μm (preferably, 0.5 to 10 μm). In Embodiment 9, an SOG film having a thickness of 1 μm is used as the bonding layer 1606.

A fluid 1607 is sprayed from a nozzle 1608 onto the bonding layer 1606. In order to efficiently spray the fluid 1607 onto the entire exposed portion of the bonding layer 1606, it is recommended to spray the fluid while rotating the bonding layer 1606 around a central line perpendicular to the substrate 1601, as is indicated with an arrow in FIG. 17.

The fluid 1607, to which a pressure of $1 \times 10^7$ to $1 \times 10^9$ Pa (preferably, $3 \times 10^7$ to $5 \times 10^8$ Pa) is applied, is sprayed from the nozzle 1608 onto the exposed portion of the bonding layer 1606. Since the sample rotates, the fluid 1607 is sprayed along the exposed surface of the bonding layer 1606.

When the fluid emitted from the nozzle 1608 is sprayed onto the bonding layer 1606, the bonding layer is broken due to impact for its fragility and then is removed or is chemically removed. As a result, the bonding layer 1606 is broken or removed to separate the substrate 1601 and the insulating film 1605 from each other. In the case where the separation is achieved by breaking the bonding layer 1606, the remaining bonding layer may be removed by etching.

As the fluid 1607, a liquid such as water, an organic solvent, an acid solution or an alkaline solution may be used. Alternatively, air, a nitrogen gas, a carbon dioxide gas or a rare gas may be also used. Furthermore, a plasma obtained from these gases may be used.

Embodiment 9 can be carried out in combination with Embodiments 1 to 8.

Embodiment 10

In this embodiment, an external light emitting quantum efficiency can be remarkably improved by using an organic light emitting material by which phosphorescence from a triplet exciton can be employed for emitting a light. As a result, the power consumption of OLED can be reduced, the lifetime of OLED can be elongated and the weight of OLED can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

(Chemical formula 1)

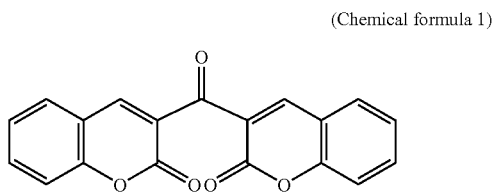

(M. A. Baldo, D. F. O'Brien, Y. You, A. Shoustikov, S. Sibley, M. E. Thompson, S. R. Forrest, Nature 395 (1998) p.151)

The molecular formula of an organic light emitting material (Pt complex) reported by the above article is represented as follows.

(Chemical formula 2)

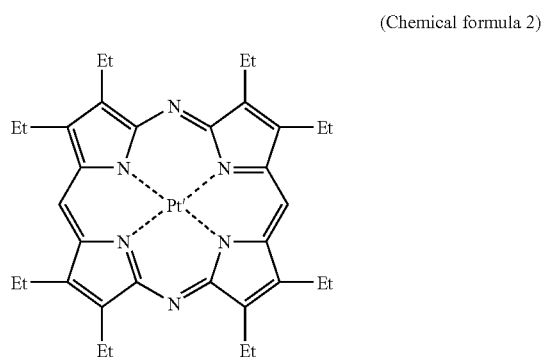

(M. A. Baldo, S. Lamansky, P. E. Burrows. M. E. Thompson, S. R. Forrest, Appl. Phys. Lett., 75 (1999) p.4.)

(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an organic light emitting material (Ir complex) reported by the above article is represented as follows.

(Chemical formula 3)

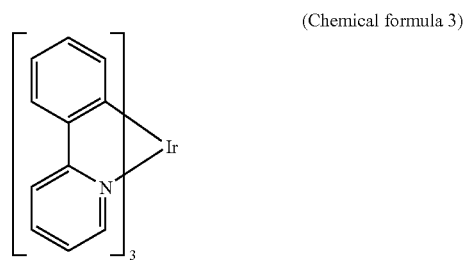

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of the Embodiments 1 to 9.

Embodiment 11

A film made of an organic light emitting material is generally formed by an ink jet method, a spin-coating method or an evaporation method. In Embodiment 11, a method for forming an organic light emitting layer other than the above-mentioned methods will be described.

In this embodiment, a film containing molecular assemblies of an organic light emitting material is formed on a substrate under an inert gas atmosphere by spraying, using a colloidal solution in which molecular assemblies constituting the organic light emitting material are dispersed (also referred to as a sol). The organic light emitting material is present as particles, each being an assembly of several molecules in a liquid.

Figure 18:
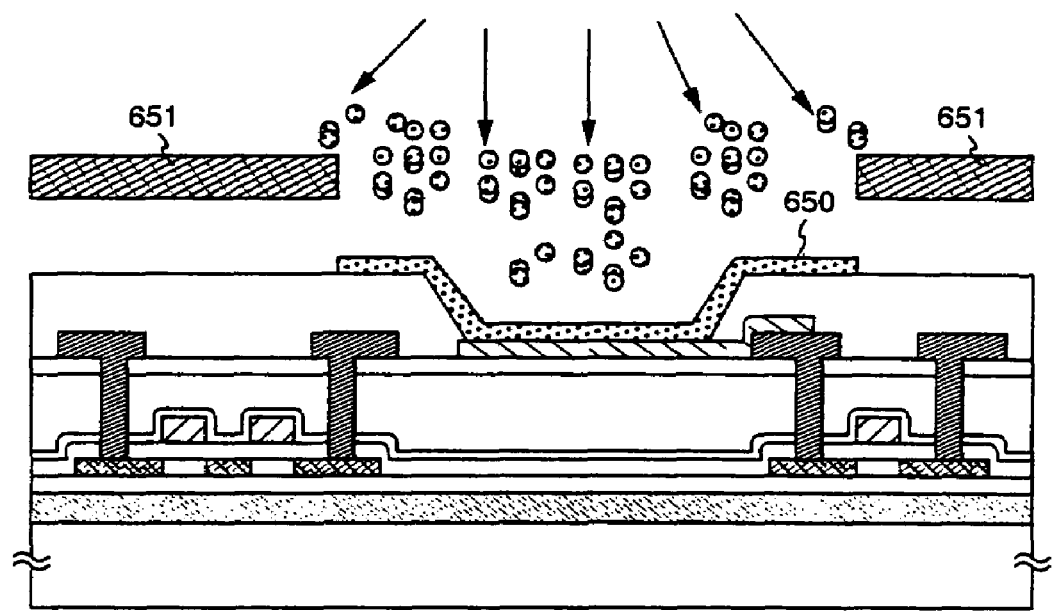
FIG. 18 is a diagram illustrating how an organic light emitting layer is formed by spraying.

FIG. 18 shows the formation of an organic light emitting layer 650 by spraying a composition from a nozzle (not shown) in an inert gas (in this embodiment, a nitrogen gas). The composition is obtained by dispersing tris (2-phenylpyridine) iridium ($Ir(ppy)_3$) which is an iridium complex serving as an organic light emitting material, and bathocupuroine (BCP) which is an organic light emitting material serving as a host (hereinafter, referred to as a host material) in toluene.

In FIG. 18, the organic light emitting layer 650 is selectively formed to have a thickness of 25 to 40 nm by using a mask 651. Both the iridium complex and BCP are insoluble to toluene.

In practice, there are some cases where the organic light emitting layer is used in a single-layered form and the other cases where it is used in a multi-layered form. In the case where the organic light emitting layer has a multi-layered structure, another (other) organic light emitting layer(s) is (are) formed in a similar manner after formation of the organic light emitting layer 650. In this case, all the deposited organic light emitting layers are collectively referred to as the organic light emitting layer.

A film formation method of this embodiment allows the formation of a film even if the organic light emitting material in a liquid is in any state. Particularly, this method permits an organic light emitting layer with good quality to be formed by using an organic light emitting material that is hardly dissolved. Moreover, since a film is formed by spraying a liquid containing an organic light emitting material with use of a carrier gas, the film formation can be achieved within a short period of time. A method of producing a liquid containing an organic light emitting material to be sprayed can be extremely simplified. Furthermore, in this embodiment, a mask is used to form a film having a desired pattern, so that the film formation is conducted through an opening of the mask. In addition, in order to efficiently use an expensive organic light emitting material, it is possible to collect the organic light emitting material adhered to the mask for reuse.

The ink jet method and the spin-coating method have a restriction in that an organic light emitting material having a high solubility to a solvent cannot be used. The evaporation has a restriction in that an organic light emitting material which decomposes before evaporation cannot be used. However, the film formation method of this embodiment is not affected by the above-mentioned restrictions.

As examples of the organic light emitting material suitable for the film formation method of this embodiment, quinacridon, tris (2-phenylpyridine) iridium, bathocuproine, poly(1,4-phenylenevinylene), poly(1,4-naphthalene vinylene), poly(2-phenyl-1,4-phenylenevinylene), polythiophene, poly(3-phenylthiophene), poly (1,4-phenylene), poly(2,7-fluorene) and the like can be given.

The structure of Embodiment 11 can be carried out in free combination with any of Embodiments 1 to 10.

Embodiment 12

Figure 19A:
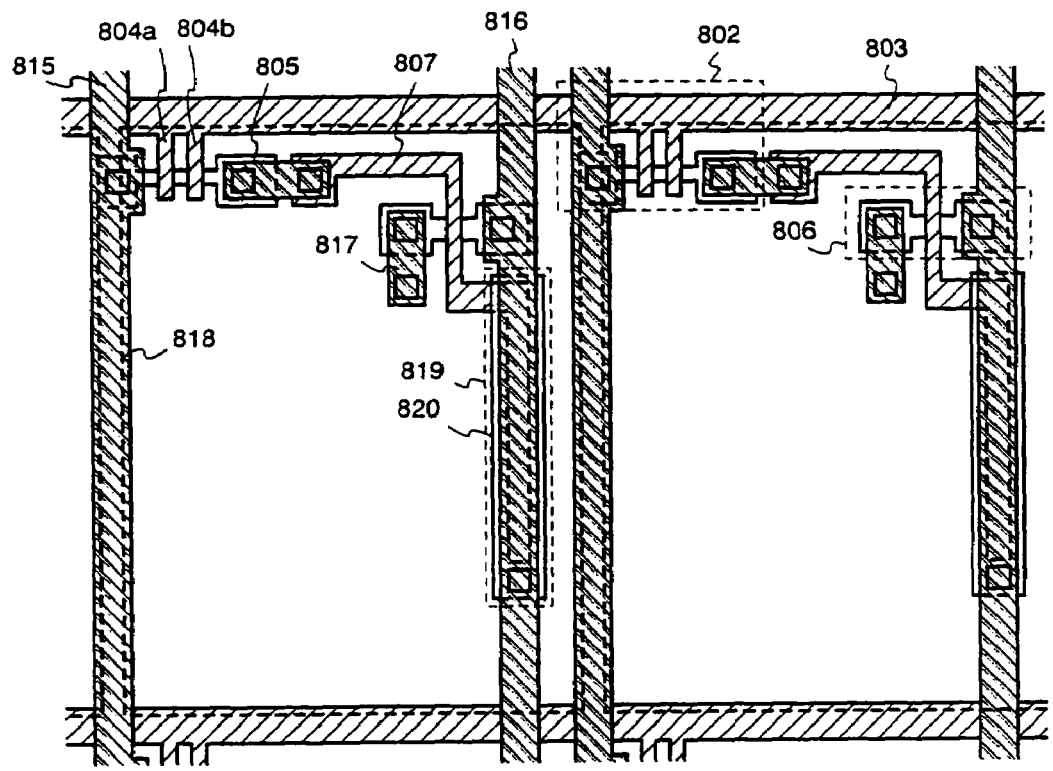
FIGS. 19A and 19B are a top view of pixels and a circuit diagram of pixels.
Figure 19B:
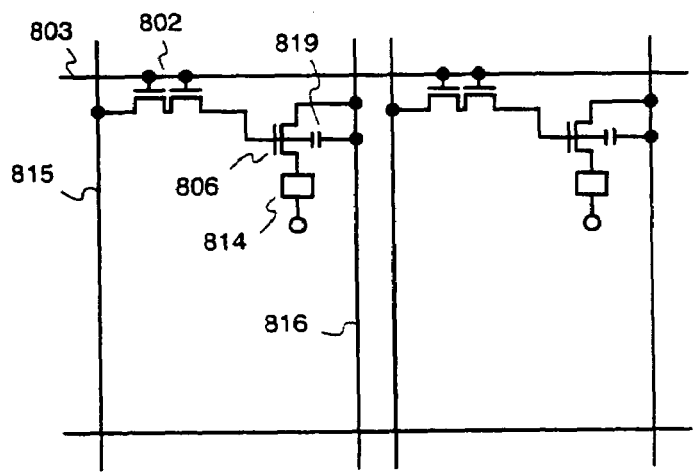

This embodiment gives descriptions that are more detailed of the pixel portion of the light-emitting device obtained by the present invention in Embodiment 12. The top structure of the pixel portion is shown in FIG. 19A whereas the circuit diagram thereof is shown in FIG. 19B. Common reference symbols are used in FIG. 19A and FIG. 19B to be cross-referred.

A switching TFT 802 has a source connected to a source wiring 815, a drain connected to a drain wiring 805 and gate electrodes 804a and 804b which are derived from a gate wiring 803. The drain wiring 805 is electrically connected to a gate electrode 807 of a current controlling TFT 806. The current controlling TFT 806 has a source electrically connected to a current supply line 816 and has a drain electrically connected to a drain wiring 817. The drain wiring 817 is electrically connected to a pixel electrode 818 indicated by the dotted line. Reference numeral 814 denotes an EL element.

A storage capacitor is formed here in a region denoted by 819. The storage capacitor 819 is composed of a semiconductor film 820 that is electrically connected to the current supply line 816, an insulating film (not shown) on the same layer as the gate insulating film, and the gate electrode 807. A capacitor composed of the gate electrode 807, the same layer (not shown) as the first interlayer insulating film, and the current supply line 816 may also be used as a storage capacitor.

This embodiment 12 can be combined with Embodiments 1 to 11.

Embodiment 13

Figure 20:
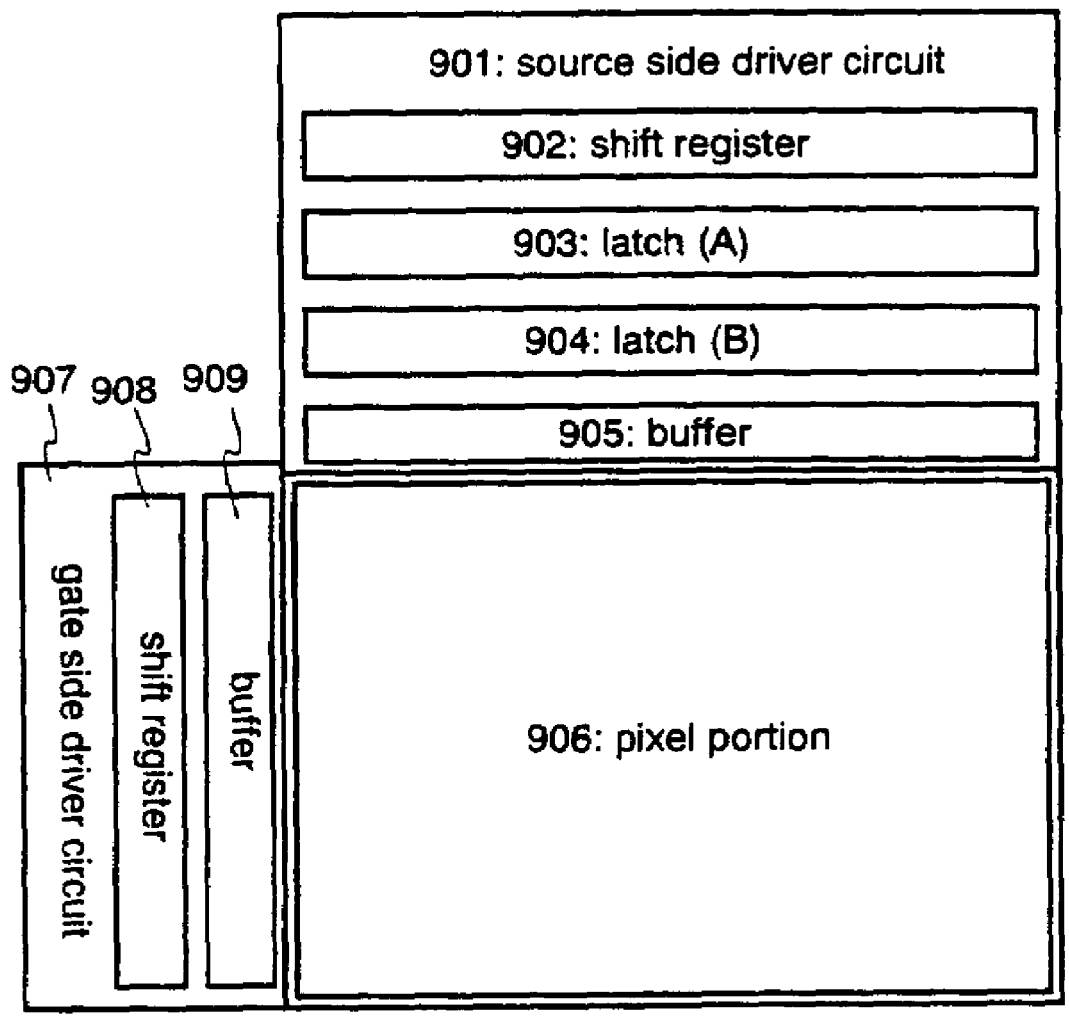
FIG. 20 is a diagram showing the circuit structure of a light-emitting device.

This embodiment shows an example of the circuit structure of the light-emitting device with reference to FIG. 20. The circuit structure shown in this embodiment is for digital driving. The structure according to this embodiment has a source side driver circuit 901, a pixel portion 906 and a gate side driver circuit 907.

The source side driver circuit 901 is provided with a shift register 902, a latch (A) 903, a latch (B) 904, and a buffer 905. In the case of analog driving, a sampling circuit (transfer gate) is provided in place of the latches (A) and (B). The gate side driver circuit 907 is provided with a shift register 908 and a buffer 909. However, the buffer 909 is not always necessary to provide.

In this embodiment, the pixel portion 906 includes a plurality of pixels, each of which is provided with OLED. It is preferable that a cathode of OLED is electrically connected to a drain of a current controlling TFT.

The source side driver circuit 901 and the gate side driver circuit 907 are composed of n-channel TFTs or p-channel TFTs obtained in accordance with Embodiments 2 to 4.

Though not shown, another gate side driver circuit may be added opposite the gate side driver circuit 907 across the pixel portion 906. In this case, two of the gate side driver circuits have the same structure and share a gate wiring, so that the other can send a gate signal in place of the broken one to make the pixel portion operate normally.

This embodiment can be combined with Embodiments 1 to 12.

Embodiment 14

Being self-luminous, a light-emitting device using a light emitting element has better visibility in bright places and wider viewing angle than liquid crystal display devices. Therefore, the light-emitting device can be used to the display units of various electric appliances.

Given as examples of an electric appliance that employs a light-emitting device manufactured in accordance with the present invention are video cameras, digital cameras, goggle type displays (head mounted displays), navigation systems, audio reproducing devices (such as car audio and audio components), lap-top computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore, it is preferable for portable information terminals to employ the light-emitting device using the light emitting element. Specific examples of these electric appliances are shown in FIGS. 21A to 21D.

Figure 21A:
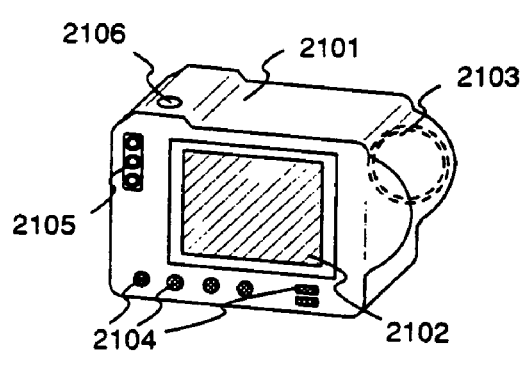
FIGS. 21A to 21D are diagrams of electronic equipment that use a light-emitting device of the present invention.

FIG. 21A shows a digital still camera, which is composed of a main body 2101, a display unit 2102, an image receiving unit 2103, operation keys 2104, an external connection port 2105, a shutter 2106, etc. The light-emitting device manufactured in accordance with the present invention can be applied to the display unit 2102.

Figure 21B:
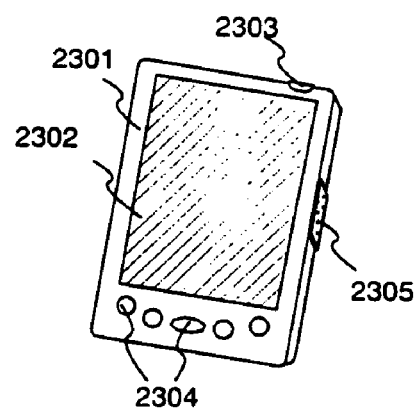

FIG. 21B shows a mobile computer, which is composed of a main body 2301, a display unit 2302, a switch 2303, operation keys 2304, an infrared port 2305, etc. The light-emitting device manufactured in accordance with the present invention can be applied to the display unit 2302.

Figure 21C:
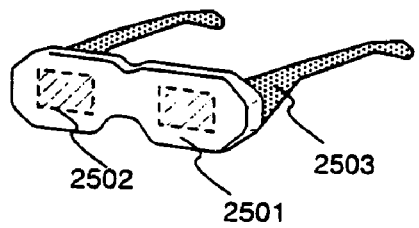

FIG. 21C shows a goggle type display (head mounted display), which is composed of a main body 2501, display units 2502, and arm units 2503. The light-emitting device manufactured in accordance with the present invention can be applied to the display units 2502.

Figure 21D:
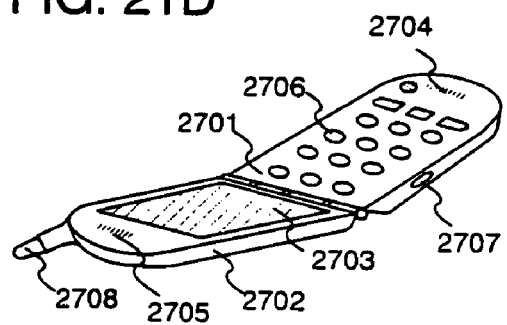

FIG. 21D shows a portable telephone, which is composed of a main body 2701, a case 2702, a display unit 2703, an audio input unit 2704, an audio output unit 2705, operation keys 2706, an external connection port 2707, an antenna 2708, etc. The light-emitting device manufactured in accordance with the present invention can be applied to the display unit 2703. If the display unit 2703 displays white letters on black background, the cellular phone consumes less power.

If the luminance of light emitted from organic materials is raised in future, the light-emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light-emitting device is suitable for animation display.

In the light emitting device, light emitting portions consume power and therefore it is preferable to display information in a manner that requires less light emitting portions. When using the light-emitting device in display units of portable information terminals, particularly cellular phones and audio reproducing devices that mainly display text information, it is preferable to drive the device such that non-light emitting portions form a background and light emitting portions form text information.

As described above, the application range of the light-emitting device of the present invention is so wide that it is applicable to electric appliances of any field. The electric appliances of this embodiment can employ any light-emitting device shown in Embodiments 1 to 13.

Embodiment 15

Organic light emitting materials used in OLEDs are roughly divided into low molecular weight materials and high molecular weight materials. A light-emitting device of the present invention can employ a low molecular weight organic light emitting material and a high molecular weight organic light emitting material both.

A low molecular weight organic light emitting material is formed into a film by evaporation. This makes it easy to form a laminate structure, and the efficiency is increased by layering films of different functions such as a hole transporting layer and an electron transporting layer.

Examples of low molecular weight organic light emitting material include an aluminum complex having quinolinol as a ligand ($Alq_3$) and a triphenylamine derivative (TPD).

On the other hand, a high molecular weight organic light emitting material is physically stronger than a low molecular weight material and enhances the durability of the element. Furthermore, a high molecular weight material can be formed into a film by application and therefore manufacture of the element is relatively easy.

The structure of a light emitting element using a high molecular weight organic light emitting material is basically the same as the structure of a light emitting element using a low molecular weight organic light emitting material, and has a cathode, an organic light emitting layer, and an anode. When an organic light emitting layer is formed from a high molecular weight organic light emitting material, a two-layer structure is popular among the known ones. This is because it is difficult to form a laminate structure using a high molecular weight material unlike the case of using a low molecular weight organic light emitting material. Specifically, an element using a high molecular weight organic light emitting material has a cathode (an Al alloy), a light emitting layer, a hole transporting layer, and an anode (ITO). Ca may be employed as the cathode material in a light emitting element using a high molecular weight organic light emitting material.

The color of light emitted from an element is determined by the material of its light emitting layer. Therefore, a light emitting element that emits light of desired color can be formed by choosing an appropriate material. The high molecular weight organic light emitting material that can be used to form a light emitting layer is a polyparaphenylene vinylene-based material, a polyparaphenylene-based material, a polythiophen-based material, or a polyfluorene-based material.

The polyparaphenylene vinylene-based material is a derivative of poly(paraphenylene vinylene) (denoted by PPV), for example, poly(2,5-dialkoxy-1,4-phenylene vinylene) (denoted by RO-PPV), poly(2-(2'-ethyl-hexoxy)-5-metoxy-1,4-phenylene vinylene) (denoted by MEH-PPV), and poly(2-(dialkoxyphenyl)-1,4-phenylene vinylene) (denoted by ROPh-PPV).

The polyparaphenylene-based material is a derivative of polyparaphenylene (denoted by PPP), for example, poly(2,5-dialkoxy-1,4-phenylene) (denoted by RO-PPP) and poly(2,5-dihexoxy-1, 4-phenylene).

The polythiophene-based material is a derivative of polythiophene (denoted by PT), for example, poly(3-alkylthiophene) (denoted by PAT), poly(3-hexylthiophene) (denoted by PHT), poly(3-cyclohexylthiophene) (denoted by PCHT), poly(3-cyclohexyl-4-methylthiophene) (denoted by PCHMT), poly(3,4-dicyclohexylthiophene) (denoted by PDCHT), poly[3-(4-octylphenyl)-thiophene] (denoted by POPT), and poly[3-(4-octylphenyl)-2,2 bithiophene] (denoted by PTOPT).

The polyfluorene-based material is a derivative of polyfluorene (denoted by PF), for example, poly(9, 9-dialkylfluorene) (denoted by PDAF) and poly(9,9-dioctylfluorene) (denoted by PDOF).

If a layer that is formed of a high molecular weight organic light emitting material capable of transporting holes is sandwiched between an anode and a high molecular weight organic light emitting material layer that emits light, injection of holes from the anode is improved. This hole transporting material is generally dissolved into water together with an acceptor material, and the solution is applied by spin coating or the like. Since the hole transporting material is insoluble in an organic solvent, the film thereof can form a laminate with the above-mentioned organic light emitting material layer that emits light.

The high molecular weight organic light emitting material capable of transporting holes is obtained by mixing PEDOT with camphor sulfonic acid (denoted by CSA) that serves as the acceptor material. A mixture of polyaniline (denoted by PANI) and polystyrene sulfonic acid (denoted by PSS) that serves as the acceptor material may also be used.

The structure of this embodiment may be freely combined with any of the structures of Embodiments 1 through 14.

According to the present invention, the entire substrate on which an OLED is formed is sealed in vacuum using a plastic film that has a sealing film, to thereby increase the effect of preventing degradation of the OLED due to moisture and oxygen and enhance the stability of the OLED. The present invention therefore can provide a highly reliable light-emitting device.

The present invention has a laminate structure including a plurality of inorganic insulating films and, even if one of the inorganic insulating films is cracked, the rest of the inorganic insulating films effectively prevent moisture and oxygen from entering the organic light emitting layer. With a laminate structure of the plurality of inorganic insulating films, the present invention can effectively prevent moisture and oxygen from entering the organic light emitting layer even when the quality of the inorganic insulating films is degraded by low temperature during formation of the inorganic insulating film.

The internal stress of the entire insulating films can be relaxed if an organic insulating film that is smaller in internal stress than the inorganic insulating films is interposed between the inorganic insulating films. Compared to a single layer of inorganic insulating film having the same thickness as the total thickness of the inorganic insulating films sandwiching the organic insulating film, cracking due to the internal stress takes place less frequently in the inorganic insulating films sandwiching the organic insulating film.

Accordingly the inorganic insulating films sandwiching the organic insulating film is more effective in preventing moisture and oxygen from entering the organic light emitting layer than a single layer of inorganic insulating film even if the total thickness of the inorganic insulating films sandwiching the organic insulating film is equal to the thickness of the single layer inorganic insulating film. Furthermore, the inorganic insulating films sandwiching the organic insulating film is strong against cracking due to the internal stress.

What is claimed is:

1. A light-emitting device comprising:
a panel including a first plastic substrate and a second plastic substrate;
a flexible tape attached to the panel;
a light emitting element formed between the first plastic substrate and the second plastic substrate;
a drying agent formed in contact with an end face of the panel and with the flexible tape;
a plurality of insulating films covering the first plastic substrate and the second plastic substrate; and
a plastic film covering the plurality of insulating films,
wherein an internal stress of at least one of the plurality of insulating films is smaller than those of the other insulating films.

2. A light-emitting device according to claim 1, wherein the second plastic substrate is flexible.

3. A light-emitting device according to claim 1, wherein the second plastic substrate comprises one selected from the group consisting of polyether sulfone, polycarbonate, polyethylene terephthalate, and polyethylene naphthalate.

4. A light-emitting device according to claim 1, wherein the other insulating films comprise one selected from the group consisting of silicon nitride, silicon oxynitride, aluminum oxide, aluminum nitride, aluminum oxynitride, and aluminum silicon oxynitride.

5. A light-emitting device according to claim 1, wherein the at least one of the plurality of insulating films comprises one selected from the group consisting of polyimide, acrylic, polyamide, polyimideamide, benzocyclobutene, an epoxy resin, polyethylene, polytetrafluoroethyelen, polystyrene, poly(p-phenylene vinylene), polyvinyl chloride, and a polyparaxylylene-based resin.

6. A light-emitting device according to claim 1, wherein the first plastic substrate is flexible.

7. A light-emitting device according to claim 1, wherein the plastic film is flexible.

8. A light-emitting device according to claim 1, wherein the plastic film comprises at least one selected from the group consisting of polyester, polypropylene, polyvinyl chloride, polyvinyl fluoride, polystyrene, polyacrylonitrile, polyethylene terephthalate, and nylon.

9. A light-emitting device according to claim 1, wherein the drying agent comprises a barium oxide.

10. A light-emitting device according to claim 1, wherein the light-emitting device is incorporated in at least one selected from the group consisting of a video camera, a digital camera, a goggle-type display, a personal computer, and a portable telephone.

11. A light-emitting device comprising:
a panel including a first plastic substrate and a second plastic substrate;
a flexible tape attached to the panel;
a light emitting element formed between the first plastic substrate and the second plastic substrate;
a drying agent formed in contact with an end face of the panel and with the flexible tape;
a first insulating film covering the first plastic substrate and the second plastic substrate;
a second insulating film covering the first insulating film;
a third insulating film covering the second insulating film; and
a plastic film covering the third insulating film,
wherein an internal stress of the second insulating film is smaller than that of the first insulating film and that of the third insulating film.

12. A light-emitting device according to claim 11, wherein the second plastic substrate is flexible.

13. A light-emitting device according to claim 11, wherein the second plastic substrate comprises one selected from the group consisting of polyether sulfone, polycarbonate, polyethylene terephthalate, and polyethylene naphthalate.

14. A light-emitting device according to claim 11, wherein at least one of the first insulating film and the third insulating film comprises one selected from the group consisting of silicon nitride, silicon oxynitride, aluminum oxide, aluminum nitride, aluminum oxynitride, and aluminum silicon oxynitride.

15. A light-emitting device according to claim 11, wherein the second insulating film comprises one selected from the group consisting of polyimide, acrylic, polyamide, polyimideamide, benzocyclobutene, an epoxy resin, polyethylene, polytetrafluoroethyelen, polystyrene, poly(p-phenylene vinylene), polyvinyl chloride, and a polyparaxylylene-based resin.

16. A light-emitting device according to claim 11, wherein the first plastic substrate is flexible.

17. A light-emitting device according to claim 11, wherein the plastic film is flexible.

18. A light-emitting device according to claim 11, wherein the plastic film comprises one selected from the group consisting of polyester, polypropylene, polyvinyl chloride, polyvinyl fluoride, polystyrene, polyacrylonitrile, polyethylene terephthalate, and nylon.

19. A light-emitting device according to claim 11, wherein the drying agent comprises a barium oxide.

20. A light-emitting device according to claim 11, wherein the light-emitting device is incorporated in at least one selected from the group consisting of a video camera, a digital camera, a goggle-type display, a personal computer, and a portable telephone.

21. A light-emitting device comprising:
a light emitting element formed over a substrate;
a flexible tape attached to the substrate;
a drying agent formed in contact with an end face of the substrate and with the flexible tape;
a plurality of insulating films covering the substrate and the light emitting element; and
a plastic film covering the plurality of insulating films,
wherein an internal stress of at least one of the plurality of insulating films is smaller than those of the other insulating films.

22. A light-emitting device according to claim 21, wherein the other insulating films comprise one selected from the group consisting of silicon nitride, silicon oxynitride, aluminum oxide, aluminum nitride, aluminum oxynitride, and aluminum silicon oxynitride.

23. A light-emitting device according to claim 21, wherein the at least one of the plurality of insulating films comprises one selected from the group consisting of polyimide, acrylic, polyamide, polyimideamide, benzocyclobutene, an epoxy resin, polyethylene, polytetrafluoroethyelen, polystyrene, poly(p-phenylene vinylene), polyvinyl chloride, and a polyparaxylylene-based resin.

24. A light-emitting device according to claim 21, wherein the substrate is flexible.

25. A light-emitting device according to claim 21, wherein the plastic film is flexible.

26. A light-emitting device according to claim 21, wherein the substrate comprises one selected from the group consisting of polyether sulfone, polycarbonate, polyethylene terephthalate, and polyethylene naphthalate.

27. A light-emitting device according to claim 21, wherein the plastic film comprises one selected from the group consisting of polyester, polypropylene, polyvinyl chloride, polyvinyl fluoride, polystyrene, polyacrylonitrile, polyethylene terephthalate, and nylon.

28. A light-emitting device according to claim 21, wherein the drying agent comprises a barium oxide.

29. A light-emitting device according to claim 21, wherein the light-emitting device is incorporated in at least one selected from the group consisting of a video camera, a digital camera, a goggle-type display, a personal computer, and a portable telephone.

30. A light-emitting device comprising:
   a light emitting element formed over a substrate;
   a flexible tape attached to the substrate;
   a drying agent formed in contact with an end face of the substrate and with the flexible tape;
   a first insulating film covering the substrate and the light emitting element;
   a second insulating film covering the first insulating film;
   a third insulating film covering the second insulating film; and
   a plastic film covering the third insulating film,
   wherein an internal stress of the second insulating film is smaller than that of the first insulating film and that of the third insulating film.

31. A light-emitting device according to claim 30, wherein at least one of the first insulating film and the third insulating film comprises one selected from the group consisting of silicon nitride, silicon oxynitride, aluminum oxide, aluminum nitride, aluminum oxynitride, and aluminum silicon oxynitride.

32. A light-emitting device according to claim 30, wherein the second insulating film comprises one selected from the group consisting of polyimide, acrylic, polyamide, polyimideamide, benzocyclobutene, an epoxy resin, polyethylene, polytetrafluoroethyelen, polystyrene, poly(p-phenylene vinylene), polyvinyl chloride, and a polyparaxylylene-based resin.

33. A light-emitting device according to claim 30, wherein the substrate is flexible.

34. A light-emitting device according to claim 30, wherein the plastic film is flexible.

35. A light-emitting device according to claim 30, wherein the substrate comprises one selected from the group consisting of polyether sulfone, polycarbonate, polyethylene terephthalate, and polyethylene naphthalate.

36. A light-emitting device according to claim 30, wherein the plastic film comprises one selected from the group consisting of polyester, polypropylene, polyvinyl chloride, polyvinyl fluoride, polystyrene, polyacrylonitrile, polyethylene terephthalate, and nylon.

37. A light-emitting device according to claim 30, wherein the drying agent comprises a barium oxide.

38. A light-emitting device according to claim 30, wherein the light-emitting device is incorporated in at least one selected from the group consisting of a video camera, a digital camera, a goggle-type display, a personal computer, and a portable telephone.

39. A semiconductor device comprising:
   a plurality of thin film transistors formed over a substrate;
   a flexible tape attached to the substrate;
   a drying agent formed in contact with an end face of the substrate and with the flexible tape;
   a plurality of insulating films covering the substrate and the plurality of thin film transistors; and
   a plastic film covering the plurality of insulating films,
   wherein an internal stress of at least one of the plurality of insulating films is smaller than those of the other insulating films.

40. A semiconductor device according to claim 39, wherein the other insulating films comprise one selected from the group consisting of silicon nitride, silicon oxynitride, aluminum oxide, aluminum nitride, aluminum oxynitride, and aluminum silicon oxynitride.

41. A semiconductor device according to claim 39, wherein the at least one of the plurality of insulating films comprises one selected from the group consisting of polyimide, acrylic, polyamide, polyimideamide, benzocyclobutene, an epoxy resin, polyethylene, polytetrafluoroethyelen, polystyrene, poly(p-phenylene vinylene), polyvinyl chloride, and a polyparaxylylene-based resin.

42. A semiconductor device according to claim 39, wherein the substrate is flexible.

43. A semiconductor device according to claim 39, wherein the plastic film is flexible.

44. A semiconductor device according to claim 39, wherein the substrate comprises one selected from the group consisting of polyether sulfone, polycarbonate, polyethylene terephthalate, and polyethylene naphthalate.

45. A semiconductor device according to claim 39, wherein the plastic film comprises one selected from the group consisting of polyester, polypropylene, polyvinyl chloride, polyvinyl fluoride, polystyrene, polyacrylonitrile, polyethylene terephthalate, and nylon.

46. A semiconductor device according to claim 39, wherein the drying agent comprises a barium oxide.

47. A semiconductor device according to claim 39, wherein the semiconductor device is at least one selected from the group consisting of a video camera, a digital camera, a goggle-type display, a personal computer, and a portable telephone.

48. A semiconductor device comprising:
   a plurality of thin film transistors formed over a substrate;
   a flexible tape attached to the substrate;
   a drying agent formed in contact with an end face of the substrate and with the flexible tape;
   a first insulating film covering the substrate and the plurality of thin film transistor;
   a second insulating film covering the first insulating film;
   a third insulating film covering the second insulating film; and
   a plastic film covering the third insulating film,
   wherein an internal stress of the second insulating film is smaller than that of the first insulating film and that of the third insulating film.

49. A semiconductor device according to claim 48, wherein at least one of the first insulating film and the third insulating film comprises one selected from the group consisting of silicon nitride, silicon oxynitride, aluminum oxide, aluminum nitride, aluminum oxynitride, and aluminum silicon oxynitride.

50. A semiconductor device according to claim 48, wherein the second insulating film comprises one selected from the group consisting of polyimide, acrylic, polyamide, polyimideamide, benzocyclobutene, an epoxy resin, polyethylene, polytetrafluoroethyelen, polystyrene, poly(p-phenylene vinylene), polyvinyl chloride, and a polyparaxylylene-based resin.

51. A semiconductor device according to claim 48, wherein the substrate is flexible.

52. A semiconductor device according to claim 48, wherein the plastic film is flexible.

53. A semiconductor device according to claim 48, wherein the substrate comprises one selected from the group consisting of polyether sulfone, polycarbonate, polyethylene terephthalate, and polyethylene naphthalate.

54. A semiconductor device according to claim 48, wherein the plastic film comprises one selected from the group consisting of polyester, polypropylene, polyvinyl chloride, polyvinyl fluoride, polystyrene, polyacrylonitrile, polyethylene terephthalate, and nylon.

55. A semiconductor device according to claim 48, wherein the drying agent comprises a barium oxide.

56. A semiconductor device according to claim 48, wherein the semiconductor device is at least one selected from the group consisting of a video camera, a digital camera, a goggle-type display, a personal computer, and a portable telephone.

57. A semiconductor device comprising:
a plurality of thin film transistors formed over a plastic substrate;
a flexible tape attached to the plastic substrate;
a drying agent formed in contact with an end face of the plastic substrate and with the flexible tape;
a plurality of insulating films covering the plastic substrate and the plurality of thin film transistors; and
a plastic film covering the plurality of insulating films,
wherein an internal stress of at least one of the plurality of insulating films is smaller than those of the other insulating films.

58. A semiconductor device according to claim 57, wherein the other insulating films comprise one selected from the group consisting of silicon nitride, silicon oxynitride, aluminum oxide, aluminum nitride, aluminum oxynitride, and aluminum silicon oxynitride.

59. A semiconductor device according to claim 57, wherein the at least one of the plurality of insulating films comprises one selected from the group consisting of polyimide, acrylic, polyamide, polyimideamide, benzocyclobutene, an epoxy resin, polyethylene, polytetrafluoroethyelen, polystyrene, poly(p-phenylene vinylene), polyvinyl chloride, and a polyparaxylylene-based resin.

60. A semiconductor device according to claim 57, wherein the plastic substrate is flexible.

61. A semiconductor device according to claim 57, wherein the plastic film is flexible.

62. A semiconductor device according to claim 57, wherein the plastic substrate comprises one selected from the group consisting of polyether sulfone, polycarbonate, polyethylene terephthalate, and polyethylene naphthalate.

63. A semiconductor device according to claim 57, wherein the plastic film comprises one selected from the group consisting of polyester, polypropylene, polyvinyl chloride, polyvinyl fluoride, polystyrene, polyacrylonitrile, polyethylene terephthalate, and nylon.

64. A semiconductor device according to claim 57, wherein the drying agent comprises a barium oxide.

65. A semiconductor device according to claim 57, wherein the semiconductor device is at least one selected from the group consisting of a video camera, a digital camera, a goggle-type display, a personal computer, and a portable telephone.

66. A semiconductor device comprising:
a plurality of thin film transistors formed over a plastic substrate;
a flexible tape attached to the plastic substrate;
a drying agent formed in contact with an end face of the plastic substrate and with the flexible tape;
a first insulating film covering the plastic substrate and the plurality of thin film transistor;
a second insulating film covering the first insulating film;
a third insulating film covering the second insulating film; and
a plastic film covering the third insulating film,
wherein an internal stress of the second insulating film is smaller than that of the first insulating film and that of the third insulating film.

67. A semiconductor device according to claim 66, wherein at least one of the first insulating film and the third insulating film comprises one selected from the group consisting of silicon nitride, silicon oxynitride, aluminum oxide, aluminum nitride, aluminum oxynitride, and aluminum silicon oxynitride.

68. A semiconductor device according to claim 66, wherein the second insulating film comprises one selected from the group consisting of polyimide, acrylic, polyamide, polyimideamide, benzocyclobutene, an epoxy resin, polyethylene, polytetrafluoroethyelen, polystyrene, poly(p-phenylene vinylene), polyvinyl chloride, and a polyparaxylylene-based resin.

69. A semiconductor device according to claim 66, wherein the plastic substrate is flexible.

70. A semiconductor device according to claim 66, wherein the plastic film is flexible.

71. A semiconductor device according to claim 66, wherein the plastic substrate comprises one selected from the group consisting of polyether sulfone, polycarbonate, polyethylene terephthalate, and polyethylene naphthalate.

72. A semiconductor device according to claim 66, wherein the plastic film comprises one selected from the group consisting of polyester, polypropylene, polyvinyl chloride, polyvinyl fluoride, polystyrene, polyacrylonitrile, polyethylene terephthalate, and nylon.

73. A semiconductor device according to claim 66, wherein the drying agent comprises a barium oxide.

74. A semiconductor device according to claim 66, wherein the semiconductor device is at least one selected from the group consisting of a video camera, a digital camera, a goggle-type display, a personal computer, and a portable telephone.

* * * * *